United States Patent
Nomiya et al.

(10) Patent No.: US 12,244,268 B2
(45) Date of Patent: Mar. 4, 2025

(54) CIRCUIT DEVICE AND OSCILLATOR

(71) Applicant: SEIKO EPSON CORPORATION, Tokyo (JP)

(72) Inventors: Takashi Nomiya, Matsumoto (JP); Mitsuaki Sawada, Fujimi (JP)

(73) Assignee: SEIKO EPSON CORPORATION (JP)

( * ) Notice: Subject to any disclaimer, the term of this patent is extended or adjusted under 35 U.S.C. 154(b) by 94 days.

(21) Appl. No.: 18/114,322

(22) Filed: Feb. 27, 2023

(65) Prior Publication Data
US 2023/0275546 A1 Aug. 31, 2023

(30) Foreign Application Priority Data
Feb. 28, 2022 (JP) ................................ 2022-029256

(51) Int. Cl.
  *H03B 5/04* (2006.01)
  *H03B 5/32* (2006.01)
(52) U.S. Cl.
  CPC .............. *H03B 5/04* (2013.01); *H03B 5/32* (2013.01); *H03B 2200/0088* (2013.01)
(58) Field of Classification Search
  CPC ..................................................... H03B 5/04
  USPC ........................................................ 331/66
  See application file for complete search history.

(56) References Cited

U.S. PATENT DOCUMENTS

| | | | |
|---|---|---|---|
| 2005/0128018 A1* | 6/2005 | Meltzer ................... | H03L 1/022 331/176 |
| 2007/0222532 A1* | 9/2007 | Takeuchi ............... | H03B 5/366 331/176 |
| 2008/0007363 A1* | 1/2008 | Nagatomo .............. | H03L 1/022 331/176 |

FOREIGN PATENT DOCUMENTS

WO    2021/009956 A1    1/2021

* cited by examiner

*Primary Examiner* — Joseph Chang
(74) *Attorney, Agent, or Firm* — Harness, Dickey & Pierce, P.L.C.

(57) ABSTRACT

A circuit device includes an oscillation circuit configured to generate an oscillation signal and a temperature compensation circuit configured to perform temperature compensation for an oscillation frequency of the oscillation signal. The temperature compensation circuit includes a first reference current generation circuit configured to generate a first reference current, a second reference current generation circuit configured to generate a second reference current, a first compensation circuit configured to perform temperature compensation for the oscillation frequency in a first temperature range based on the first reference current, and a second compensation circuit configured to perform temperature compensation for the oscillation frequency in a second temperature range, which is higher than the first temperature range, based on the second reference current. The first reference current generation circuit reduces the first reference current as a temperature rises, or the second reference current generation circuit reduces the second reference current as the temperature drops.

13 Claims, 15 Drawing Sheets

CIRCUIT DEVICE AND OSCILLATOR

The present application is based on, and claims priority from JP Application Serial Number 2022-029256, filed Feb. 28, 2022, the disclosure of which is hereby incorporated by reference herein in its entirety.

BACKGROUND

1. Technical Field

The present disclosure relates to a circuit device, an oscillator and the like.

2. Related Art

In a circuit device including an oscillation circuit, temperature compensation of an oscillation frequency is performed. For example, WO2021/009956 (Patent Literature 1) discloses a temperature compensation circuit including a low-temperature-side circuit configured to output a low-temperature-side temperature compensation signal, a high-temperature-side circuit configured to output a high-temperature-side temperature compensation signal, and a switching circuit configured to operate the low-temperature-side circuit when a temperature is lower than a reference temperature and operate the high-temperature-side circuit when the temperature is higher than the reference temperature.

In the temperature compensation circuit disclosed in Patent Literature 1, noise is generated at the time of switching between the low-temperature-side circuit and the high-temperature-side circuit, and a noise characteristic of a clock signal deteriorates. For this reason, it is not possible to achieve both a reduction in power consumption and prevention of deterioration of a noise characteristic at the same time.

SUMMARY

An aspect of the present disclosure relates to a circuit device including an oscillation circuit configured to generate an oscillation signal and a temperature compensation circuit configured to perform temperature compensation for an oscillation frequency of the oscillation signal. The temperature compensation circuit includes a first reference current generation circuit configured to generate a first reference current, a second reference current generation circuit configured to generate a second reference current, a first compensation circuit configured to perform temperature compensation for the oscillation frequency in a first temperature range based on the first reference current, and a second compensation circuit configured to perform temperature compensation for the oscillation frequency in a second temperature range, which is higher than the first temperature range in temperature, based on the second reference current. The first reference current generation circuit reduces the first reference current as a temperature rises, or the second reference current generation circuit reduces the second reference current as the temperature drops.

Another aspect of the present disclosure relates to an oscillator including a resonator and a circuit device. The circuit device includes an oscillation circuit configured to oscillate the resonator to generate an oscillation signal, and a temperature compensation circuit configured to perform temperature compensation for an oscillation frequency of the oscillation signal. The temperature compensation circuit includes a first compensation circuit configured to perform temperature compensation for the oscillation frequency in a first temperature range, a second compensation circuit configured to perform temperature compensation for the oscillation frequency in a second temperature range that is higher than the first temperature range in temperature, a first reference current generation circuit configured to generate a first reference current serving as a reference current of the first compensation circuit, and a second reference current generation circuit configured to generate a second reference current serving as a reference current of the second compensation circuit. The first reference current generation circuit reduces the first reference current as a temperature rises, or the second reference current generation circuit reduces the second reference current as the temperature drops.

DESCRIPTION OF EXEMPLARY EMBODIMENTS

Hereinafter, an embodiment will be described. The embodiment to be described below does not unduly limit contents described in the claims. In addition, all of the configurations described in the embodiment are not necessarily essential constituent elements.

1. Circuit Device

Figure 1:
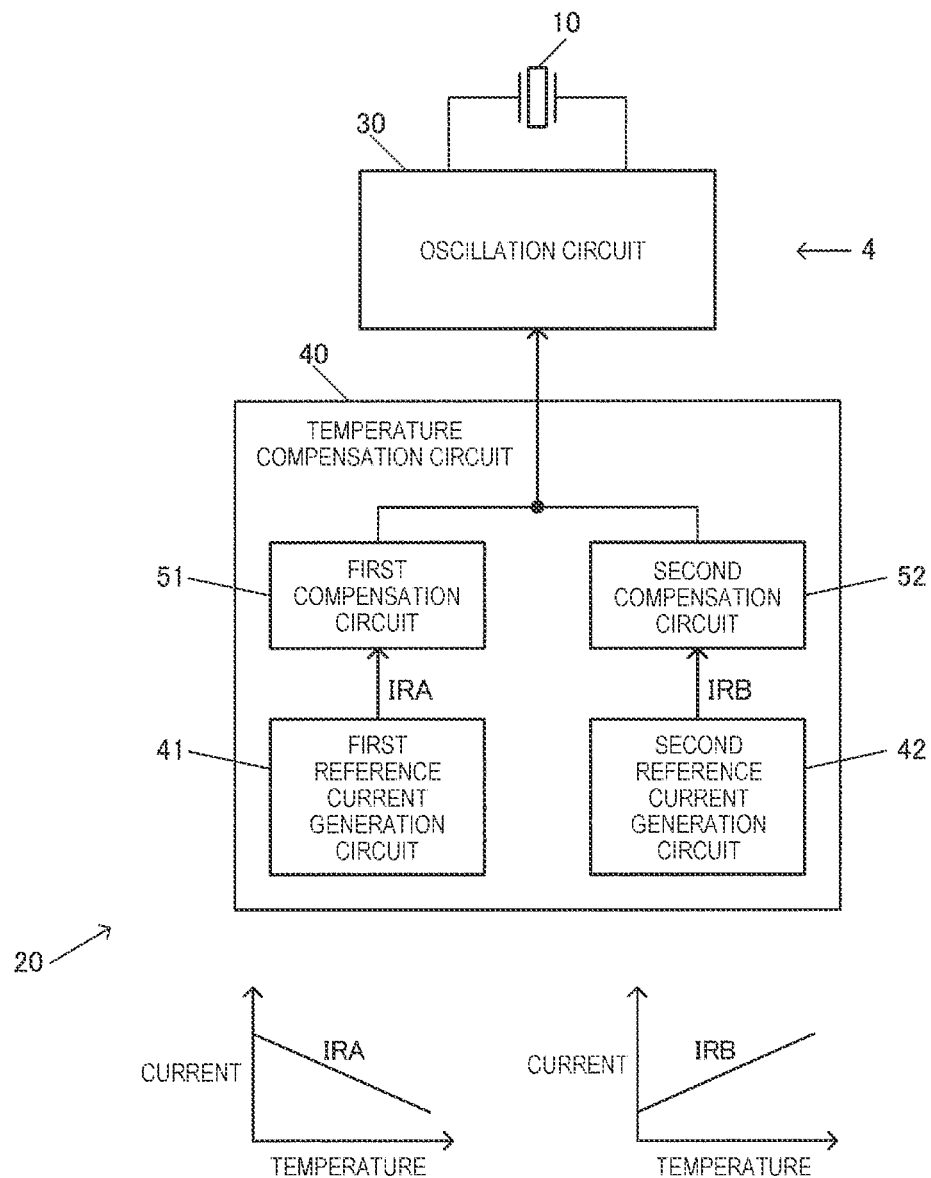
FIG. 1 is a diagram illustrating a configuration example of a circuit device and an oscillator according to an embodiment.

FIG. 1 is a diagram illustrating a configuration example of a circuit device 20 according to the embodiment. The circuit device 20 according to the embodiment includes an oscillation circuit 30 and a temperature compensation circuit 40. An oscillator 4 according to the embodiment includes a resonator 10 and the circuit device 20. The resonator 10 is electrically coupled to the circuit device 20.

The resonator 10 is an element that generates mechanical oscillation according to an electrical signal. The resonator 10 can be implemented by, for example, a resonator element such as a quartz crystal resonator element. For example, the resonator 10 can be implemented by a quartz crystal resonator element that has a cut angle of AT cut, SC cut, or the like and that performs thickness-shear oscillation, a tuning fork type quartz crystal resonator element, or a double-tuning fork type quartz crystal resonator element. For example, the resonator 10 may be a resonator that is built in a temperature compensated crystal oscillator (TCXO) not provided with an oven, or may be a resonator that is built in an oven controlled crystal oscillator (OCXO) provided with an oven. The vibrator 10 according to the embodiment can be implemented by various resonator elements such as a resonator element other than a thickness-shear oscillating type, a tuning fork type, or a double-tuning fork type, and a piezoelectric resonator element formed of a material other than quartz crystal. For example, a surface acoustic wave (SAW) resonator, or a micro electro mechanical system (MEMS) resonator as a silicon resonator formed using a silicon substrate may be employed as the resonator 10.

The circuit device 20 is an integrated circuit device called an integrated circuit (IC). For example, the circuit device 20 is an IC manufactured by a semiconductor process, and is a semiconductor chip in which a circuit element is formed on a semiconductor substrate. The circuit device 20 includes the oscillation circuit 30 and the temperature compensation circuit 40.

The oscillation circuit 30 is a circuit configured to oscillate the resonator 10. For example, the oscillation circuit 30 oscillates the resonator 10 to generate an oscillation signal. The oscillation signal is an oscillation clock signal. For example, the oscillation circuit 30 can be implemented by an oscillation drive circuit electrically coupled to one end and the other end of the resonator 10, and a passive element such as a capacitor and a resistor. The drive circuit can be implemented by, for example, a CMOS inverter circuit or a bipolar transistor. The drive circuit is a core circuit of the oscillation circuit 30, and the drive circuit oscillates the resonator 10 by driving the resonator 10 with a voltage or a current. As the oscillation circuit 30, oscillation circuits of various types such as an inverter type, a Pierce type, a Colpitts type, and a Hartley type can be used. The oscillation circuit 30 may generate an oscillation signal using an element other than the resonator 10. Note that coupling in the embodiment is electrical coupling. The electrical coupling is coupling in which electrical signals can be transmitted, and is coupling in which information can be transmitted by the electrical signals. The electrical coupling may be coupling established via a passive element or the like.

The temperature compensation circuit 40 is a circuit configured to perform temperature compensation for an oscillation frequency of the oscillation circuit 30. For example, the temperature compensation circuit 40 outputs a temperature compensation signal for temperature compensating the oscillation frequency of the oscillation circuit 30, based on a temperature detection signal from a temperature sensor (not illustrated). The temperature compensation is, for example, processing of performing compensation by reducing fluctuation of the oscillation frequency caused by temperature fluctuation. That is, the temperature compensation circuit 40 performs the temperature compensation for the oscillation frequency of the oscillation circuit 30 such that the oscillation frequency is constant even when temperature fluctuation occurs.

The temperature compensation circuit 40 includes a first reference current generation circuit 41 configured to generate a first reference current IRA and a second reference current generation circuit 42 configured to generate a second reference current IRB. The temperature compensation circuit 40 further includes a first compensation circuit 51 configured to perform temperature compensation for the oscillation frequency in a first temperature range based on the first reference current IRA, and a second compensation circuit 52 configured to perform temperature compensation for the oscillation frequency in a second temperature range, which is higher than the first temperature range in temperature, based on the second reference current IRB.

For example, the first compensation circuit 51 performs the temperature compensation for the oscillation frequency in the first temperature range, which is a low-temperature-side temperature range, based on the first reference current IRA from the first reference current generation circuit 41 and a temperature detection signal from the temperature sensor (not illustrated). For example, the first compensation circuit 51 generates a first temperature compensation signal based on the first reference current IRA and the temperature detection signal, and performs the temperature compensation for the oscillation frequency in the first temperature range in the oscillation circuit 30 based on the first temperature compensation signal. For example, the first compensation circuit 51 generates a first current as the first temperature compensation signal based on the first reference current IRA and the temperature detection signal, and performs the temperature compensation for the oscillation frequency based on a temperature compensation voltage obtained by subjecting the first current to current-voltage conversion. For example, the oscillation circuit 30 includes a variable capacitance circuit, and the temperature compensation for the oscillation frequency in the first temperature range is performed by controlling a capacitance of the variable capacitance circuit based on the temperature compensation voltage. Further, the second compensation circuit 52 generates a second temperature compensation signal based on the second reference current IRB and the temperature detection signal, and performs the temperature compensation for the oscillation frequency in the second temperature range in the oscillation circuit 30 based on the second temperature compensation signal. For example, the second compensation circuit 52 generates a second current as the second temperature compensation signal based on the second reference current IRB and the temperature detection signal, and performs the temperature compensation for the oscillation frequency based on a temperature compensation voltage obtained by subjecting the second current to current-voltage conversion. For example, the temperature compensation for the oscillation frequency in the second temperature range is performed by controlling the capacitance of the variable capacitance circuit of the oscillation circuit 30 based on the temperature compensation voltage.

In the embodiment, the first reference current generation circuit 41 reduces the first reference current IRA as a temperature rises. Alternatively, the second reference current generation circuit 42 reduces the second reference current IRB as the temperature drops. In this case, the first reference current generation circuit 41 may reduce the first reference current IRA as the temperature rises, and the second reference current generation circuit 42 may reduce the second reference current IRB as the temperature drops. The first reference current generation circuit 41 gradually reduces the first reference current IRA as the temperature rises, for example. For example, the first reference current IRA is monotonically reduced as the temperature rises. The second reference current generation circuit 42 gradually decreases the second reference current IRB as the temperature drops. For example, the second reference current IRB is monotonically decreased as the temperature drops.

As described, if the first reference current generation circuit 41 reduces the first reference current IRA, which is used for the temperature compensation for the oscillation frequency in the first temperature range, as the temperature rises, the first reference current IRA can be sufficiently reduced when the temperature is in the second temperature range on a higher temperature side than the first temperature range. Therefore, in the second temperature range in which the second compensation circuit 52 performs the temperature compensation for the oscillation frequency, it is possible to prevent the first reference current IRA and the current for temperature compensation based on the first reference current IRA from being wastefully consumed. If the second reference current generation circuit 42 reduces the second reference current IRB, which is used for the temperature compensation for the oscillation frequency in the second temperature range, as the temperature drops, the second reference current IRB can be sufficiently reduced when the temperature is in the first temperature range on a lower temperature side than the second temperature range. Therefore, in the first temperature range in which the first compensation circuit 51 performs the temperature compensation for the oscillation frequency, it is possible to prevent the second reference current IRB and the current for temperature compensation based on the second reference current IRB from being wastefully consumed. Accordingly, power consumption of the circuit device 20 can be reduced. In addition, since the first reference current generation circuit 41 reduces the first reference current IRA as the temperature rises and the second reference current generation circuit 42 reduces the second reference current IRB as the temperature drops, it is possible to prevent the first reference current IRA, the second reference current IRB, or the current for temperature compensation based on the reference current from being rapidly switched at a temperature in the vicinity of a boundary between the first temperature range and the second temperature range. Therefore, it is possible to prevent noise based on the switching from causing a noise characteristic of a clock signal to deteriorate.

Figure 2:
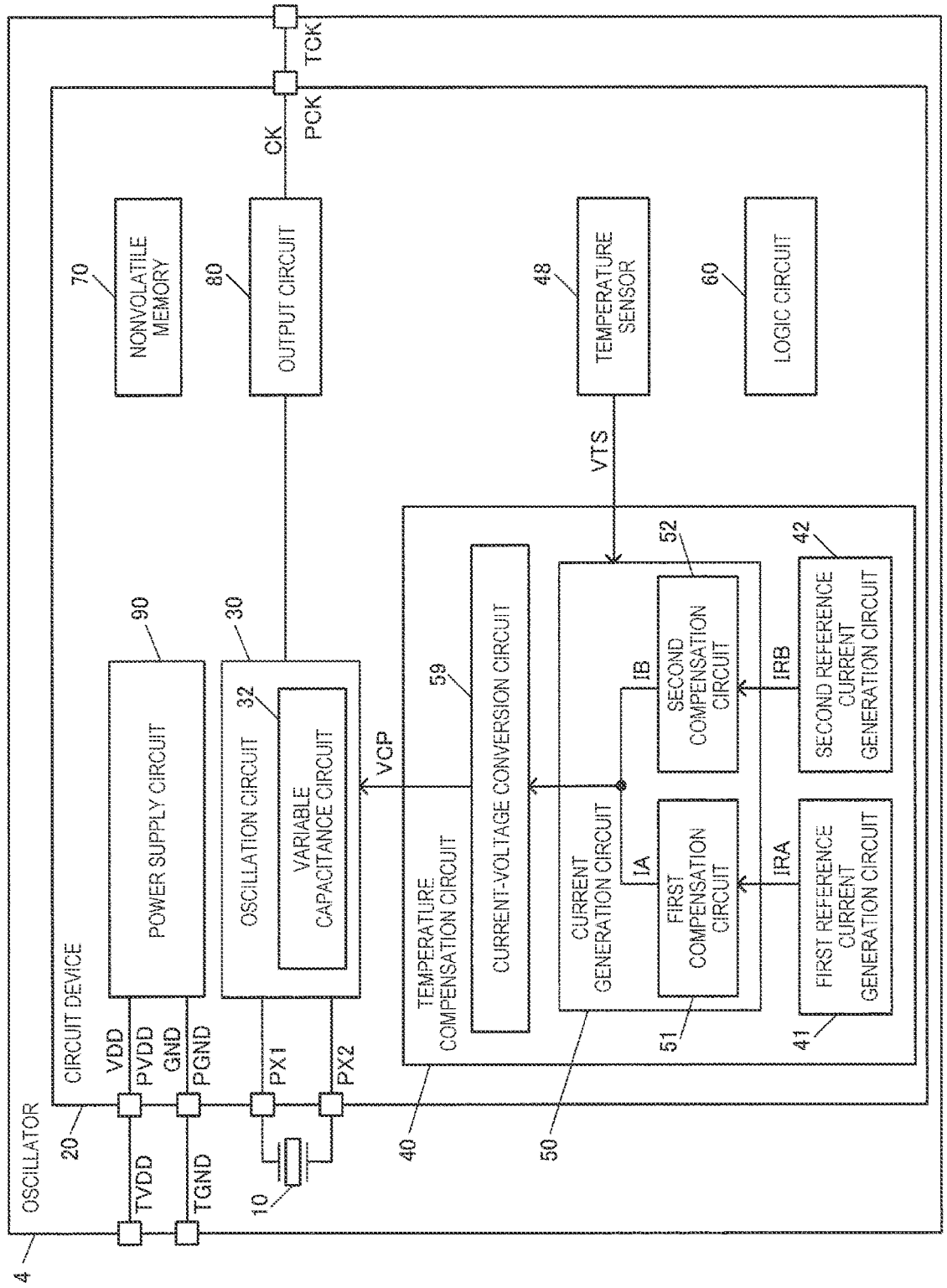
FIG. 2 is a diagram illustrating a detailed configuration example of the circuit device and the oscillator according to the embodiment.

FIG. 2 is a diagram illustrating a detailed configuration example of the circuit device 20 and the oscillator 4 according to the embodiment. In FIG. 2, the circuit device 20 includes the oscillation circuit 30, the temperature compensation circuit 40, a temperature sensor 48, a logic circuit 60, a nonvolatile memory 70, an output circuit 80, and a power supply circuit 90. The oscillator 4 includes the resonator 10 and the circuit device 20. The resonator 10 is electrically coupled to the circuit device 20. For example, the resonator 10 is electrically coupled to the circuit device 20 using an internal wiring of a package that accommodates the resonator 10 and the circuit device 20, a bonding wire, or a metal bump. The circuit device 20 and the oscillator 4 are not limited to the configuration in FIG. 2, and various modifications such as omitting a part of the components, adding other components, and replacing a part of the components with other components can be made.

The circuit device 20 includes pads PVDD, PGND, PX1, PX2, and PCK. The pad is a terminal of the circuit device 20 that is a semiconductor chip. For example, in a pad region, a metal layer is exposed from a passivation film that is an insulating layer, and the exposed metal layer forms the pad that is a terminal of the circuit device 20. The pads PVDD and PGND are a power supply pad and a ground pad, respectively. A power supply voltage VDD from an external power supply device is supplied to the pad PVDD. The pad PGND is a pad to which GND, which is a ground voltage, is supplied. GND may be referred to as VSS, and the ground voltage is, for example, a ground potential. In the embodiment, the ground voltage is appropriately described as GND. For example, VDD corresponds to a high-potential-side power supply, and GND corresponds to a low-potential-side power supply. The pads PX1 and PX2 are pads for coupling to the resonator 10. The pad PCK is an output pad of a clock signal CK. The pads PVDD, PGND and PCK are electrically coupled to terminals TVDD, TGND and TCK respectively, which are external terminals for external coupling to the oscillator 4. For example, each pad is electrically coupled to a corresponding terminal using an internal wiring of a package, a bonding wire, or a metal bump.

The oscillation circuit 30 is electrically coupled to the resonator 10 via the pads PX1 and PX2. The pads PX1 and PX2 are pads for coupling to the resonator. The oscillation drive circuit of the oscillation circuit 30 is provided between the pad PX1 and the pad PX2. The oscillation circuit 30 includes a variable capacitance circuit 32. The variable capacitance circuit 32 is a circuit configured to change a capacitance formed at least at one of the one end and the other end of the resonator 10, for example. The oscillation frequency of the oscillation circuit 30 can be adjusted by adjusting the capacitance of the variable capacitance circuit 32. That is, when the variable capacitance circuit 32 is electrically coupled to at least one of the pads PX1 and PX2, a load capacitance of the oscillation circuit 30 can be variably adjusted. The variable capacitance circuit 32 can be implemented by a variable capacitance element such as a varactor. For example, the variable capacitance circuit 32 includes at least one variable capacitance element.

The temperature compensation circuit 40 performs analog temperature compensation using polynomial approximation, for example. For example, when a temperature compensation voltage VCP for compensating a frequency-temperature characteristic of the resonator 10 is approximated using a polynomial, the temperature compensation circuit 40 performs the analog temperature compensation based on coefficient information of the polynomial. The analog temperature compensation is, for example, temperature compensation implemented by addition processing of a current signal or a voltage signal that is an analog signal. For example, when the temperature compensation voltage VCP is approximated using a high-order polynomial, a zero-order coefficient, a linear coefficient, and a high-order coefficient of the polynomial are stored in a storage unit implemented by, for example, the nonvolatile memory 70 as zero-order correction data, linear correction data, and high-order correction data, respectively. The high-order coefficient is, for example, a coefficient of an order higher than the first order, and the high-order correction data is correction data corresponding to the high-order coefficient. For example, when the temperature compensation voltage VCP is approximated using a cubic polynomial, a zero-order coefficient, a linear coefficient, a quadratic coefficient, and a cubic coefficient of the polynomial are stored in the storage unit as zero-order correction data, linear correction data, quadratic correction data, and cubic correction data. The temperature compensation circuit 40 performs temperature compensation based on the zero-order correction data to the cubic correction data. In this case, the quadratic correction data and temperature compensation based on the quadratic correction data may be omitted. For example, when the temperature compensation voltage VCP is approximated using a quintic polynomial, a zero-order coefficient, a linear coefficient, a quadratic coefficient, a cubic coefficient, a quartic coefficient, and a quintic coefficient of the polynomial are stored in the storage unit as zero-order correction data, linear correction data, quadratic correction data, cubic correction data, quartic correction data, and quintic correction data. The temperature compensation circuit 40 performs temperature compensation based on the zero-order correction data to the quintic correction data. In this case, the quadratic correction data or the quartic correction data, and the temperature compensation based on the quadratic correction data or the quartic correction data may be omitted. The order of polynomial approximation may be any order. For example, polynomial approximation of an order higher than the fifth order may be executed. The zero-order correction may be executed by the temperature sensor 48.

The temperature sensor 48 is a sensor configured to detect a temperature. Specifically, the temperature sensor 48 outputs, as a temperature detection voltage VTS, a temperature-dependent voltage that changes according to an environmental temperature. For example, the temperature sensor 48 generates the temperature detection voltage VTS, which is a temperature detection signal, using a circuit element having temperature dependency. Specifically, the temperature sensor 48 outputs the temperature detection voltage VTS, which changes depending on the temperature using, for example, temperature dependence of a forward voltage of a PN junction. A modification can also be made in which a digital temperature sensor circuit is used as the temperature sensor 48. In this case, the temperature detection voltage VTS may be generated by performing D/A conversion on temperature detection data.

The logic circuit 60 is a control circuit and executes various types of control processing. For example, the logic circuit 60 controls the entire circuit device 20 or controls an operation sequence of the circuit device 20. The logic circuit 60 executes various types of processing for controlling the oscillation circuit 30, controls the temperature sensor 48, the temperature compensation circuit 40, the output circuit 80, or the power supply circuit 90, or controls reading and writing of information from and to the nonvolatile memory 70.

The logic circuit 60 can be implemented by, for example, an application specific integrated circuit (ASIC) using automatic placement and routing such as a gate array.

The nonvolatile memory 70 is a memory that stores information even without power supply. For example, the nonvolatile memory 70 is a memory that can store information without power supply and in which information can be rewritten. The nonvolatile memory 70 stores various types of information necessary for operations of the circuit device 20 and the like. The nonvolatile memory 70 can be implemented by an electrically erasable programmable read-only memory (EEPROM) or the like that is implemented by a floating gate avalanche injection MOS memory (FAMOS memory) or a metal-oxide-nitride-oxide-silicon memory (MONOS memory). The nonvolatile memory 70 stores correction data such as linear correction data and high-order correction data used for temperature compensation of the temperature compensation circuit 40.

The output circuit 80 outputs the clock signal CK based on an oscillation signal from the oscillation circuit 30. For example, the output circuit 80 buffers an oscillation signal, which is an oscillation clock signal from the oscillation circuit 30, and outputs the buffered oscillation signal as the clock signal CK to the pad PCK. The clock signal CK is output to the outside via the clock output terminal TCK of the oscillator 4. For example, the output circuit 80 outputs the clock signal CK in a single-ended CMOS signal format. The output circuit 80 may output the clock signal CK in a signal format other than the CMOS signal format.

A clock signal generation circuit such as a PLL circuit that generates a clock signal CK having a frequency obtained by multiplying a frequency of an oscillation signal may be provided at a subsequent stage of the oscillation circuit 30, and the output circuit 80 may buffer the clock signal CK generated by the clock signal generation circuit and output the buffered clock signal CK.

The power supply circuit 90 is supplied with the power supply voltage VDD from the pad PVDD and the ground voltage GND from the pad PGND, and supplies various power supply voltages for an internal circuit of the circuit device 20 to the internal circuit. For example, the power supply circuit 90 supplies a regulated power supply voltage obtained by regulating the power supply voltage VDD to circuits of the circuit device 20 such as the oscillation circuit 30.

In FIG. 2, the temperature compensation circuit 40 includes the first reference current generation circuit 41, the second reference current generation circuit 42, a current generation circuit 50, and a current-voltage conversion circuit 59. As described with reference to FIG. 1, the first reference current generation circuit 41 generates the first reference current IRA for temperature compensation of the oscillation frequency in the first temperature range on the low temperature side. The second reference current generation circuit 42 generates the second reference current IRB for temperature compensation of the oscillation frequency in the second temperature range on the high temperature side. The current generation circuit 50 generates a function current for compensating the temperature characteristic of the oscillation frequency based on the first reference current IRA from the first reference current generation circuit 41, the second reference current IRB from the second reference current generation circuit 42, and the temperature detection voltage VTS that is a temperature detection signal from the temperature sensor 48. Specifically, the current generation circuit 50 includes the first compensation circuit 51 and the second compensation circuit 52 that are described with reference to FIG. 1. The current generation circuit 50 generates a function current for compensating the temperature characteristic of the oscillation frequency based on a first current IA and a second current IB. The first current IA is generated by the first compensation circuit 51 based on the first reference current IRA and the temperature detection signal, and the second current IB is generated by the second compensation circuit 52 based on the second reference current IRB and the temperature detection signal. Specifically, the first compensation circuit 51, which is a first current generation circuit, generates the first current IA for temperature compensation of the oscillation frequency in the first temperature range based on the first reference current IRA and the temperature detection voltage VTS that is the temperature detection signal from the temperature sensor 48.

The second compensation circuit 52, which is a second current generation circuit, generates the second current IB for temperature compensation of the oscillation frequency in the second temperature range based on the second reference current IRB and the temperature detection voltage VTS that is the temperature detection signal from the temperature sensor 48. Accordingly, a function current including the first current IA and the second current IB is output to the current-voltage conversion circuit 59. The current-voltage conversion circuit 59 performs current-voltage conversion on the function current generated by the current generation circuit 50, and outputs the temperature compensation voltage VCP for controlling the oscillation frequency to the oscillation circuit 30. For example, the capacitance of the variable capacitance circuit 32 of the oscillation circuit 30 is controlled based on the temperature compensation voltage VCP, whereby the oscillation frequency is controlled and the temperature compensation, in which the oscillation frequency is made constant even when the temperature changes, is implemented.

According to the temperature compensation circuit 40 having such a configuration, when a function current including the first current IA generated by the first compensation circuit 51 based on the first reference current IRA and the temperature detection signal is subjected to current-voltage conversion performed by the current-voltage conversion circuit 59, the temperature compensation voltage VCP for performing the temperature compensation in the first temperature range is generated. Further, when a function current including the second current IB generated by the second compensation circuit 52 based on the second reference current IRB and the temperature detection signal is subjected to current-voltage conversion performed by the current-voltage conversion circuit 59, the temperature compensation voltage VCP for performing the temperature compensation in the second temperature range is generated. Accordingly, the temperature compensation for the oscillation frequency in the first temperature range and the second temperature range is implemented.

2. Temperature Compensation Circuit

Figure 3:
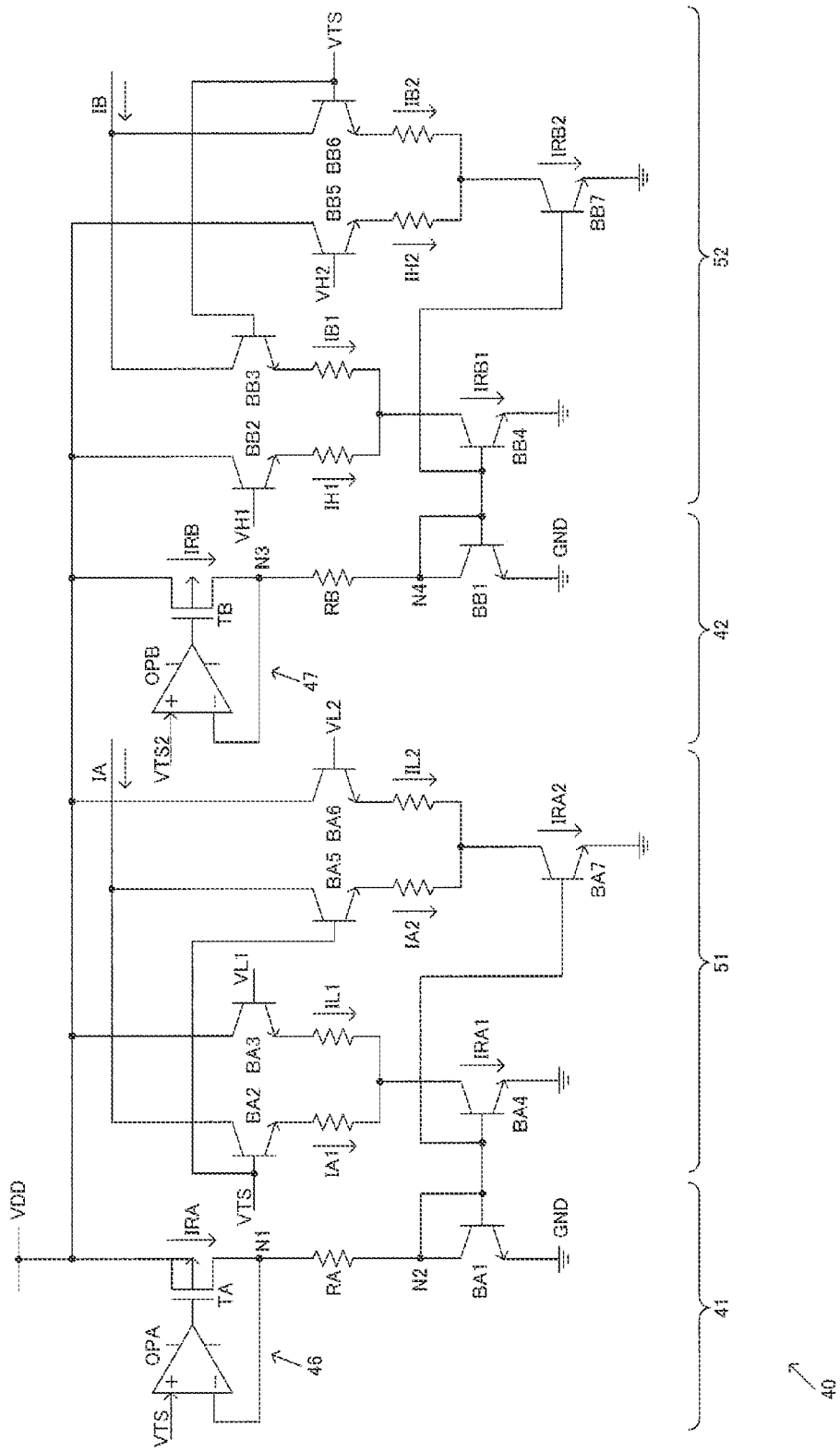
FIG. 3 is a diagram illustrating in detail a first configuration example of a temperature compensation circuit according to the embodiment.
Figure 4:
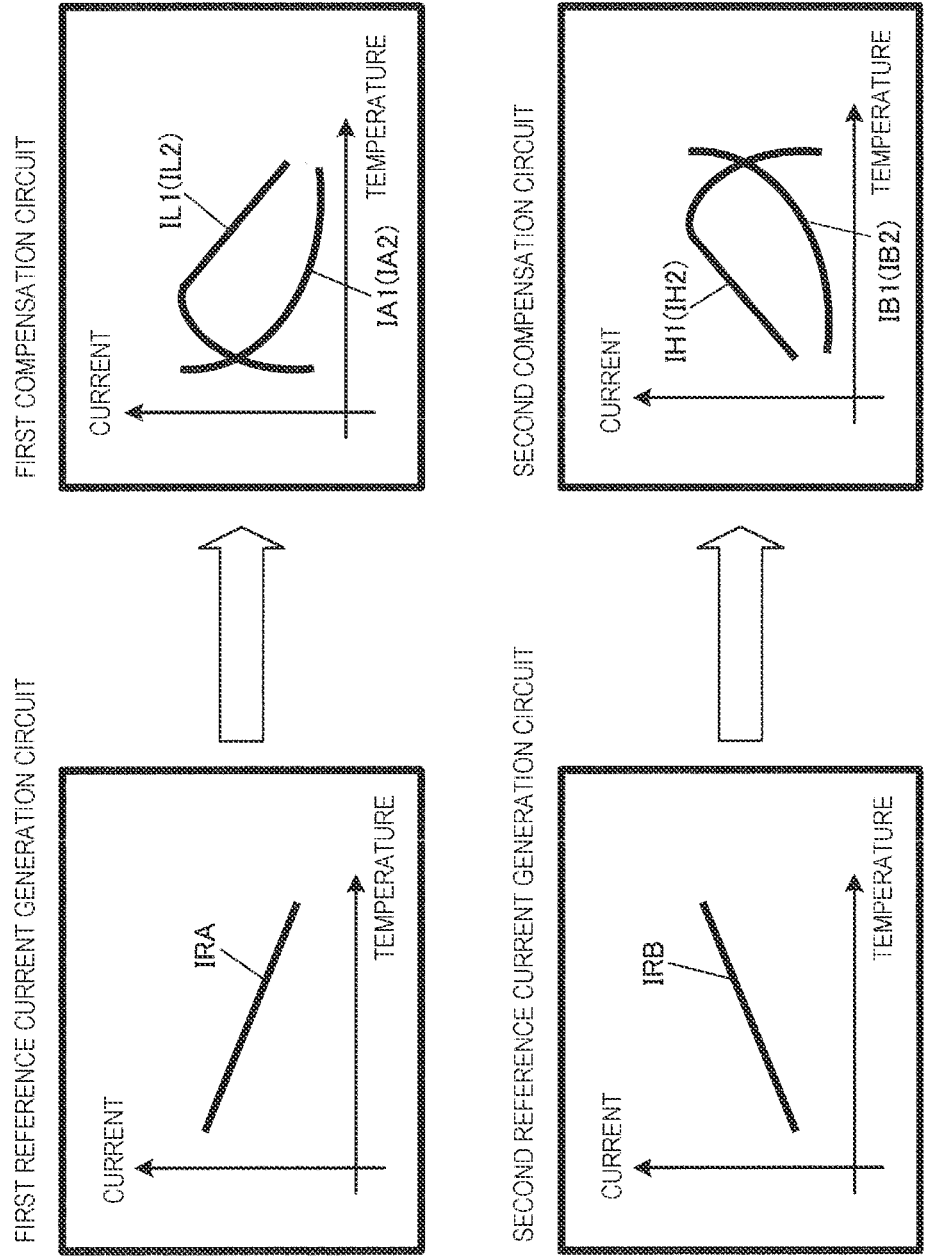
FIG. 4 is a diagram illustrating operations of the temperature compensation circuit.

FIG. 3 is a diagram illustrating in detail a first configuration example of the temperature compensation circuit 40 according to the embodiment. FIG. 4 is a diagram illustrating operations of the temperature compensation circuit 40. FIG. 3 illustrates a specific circuit configuration example of the first reference current generation circuit 41, the second reference current generation circuit 42, the first compensation circuit 51, and the second compensation circuit 52. The configurations of the circuits in the embodiment are not limited to those illustrated in FIG. 3, and various modifications can be made, such as omitting a part of the circuits or circuit elements, adding other circuits or circuit elements, or replacing a part of the circuits or circuit elements with other circuits or circuit elements.

In FIG. 3, the first reference current generation circuit 41 generates the first reference current IRA, and the second reference current generation circuit 42 generates the second reference current IRB. Specifically, as illustrated in FIG. 4, the first reference current generation circuit 41 generates the first reference current IRA whose value decreases according to an increase in temperature, and the second reference current generation circuit 42 generates the second reference current IRB whose value decreases according to a decrease in temperature. The first compensation circuit 51 generates the first current IA for performing the temperature compensation of the oscillation frequency in the first temperature range based on the first reference current IRA and the temperature detection voltage VTS. In FIG. 3, the first current IA is a current obtained by adding a current IA1 and a current IA2. The second compensation circuit 52 generates the second current IB for performing the temperature compensation of the oscillation frequency in the second temperature range based on the second reference current IRB and the temperature detection voltage VTS. In FIG. 3, the second current IB is a current obtained by adding a current IB1 and a current IB2.

Before describing the details of the temperature compensation circuit 40 in FIG. 3, problems of the temperature compensation circuit 40 will be described.

Figure 5:
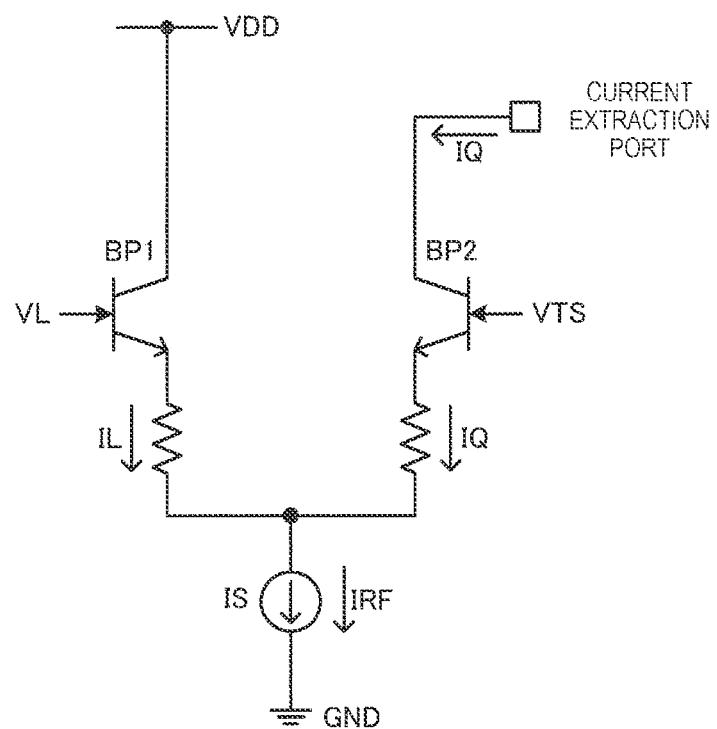
FIG. 5 is an explanatory diagram illustrating a differential pair circuit of the temperature compensation circuit.

FIG. 5 is a diagram illustrating a configuration example of a differential pair circuit used in the temperature compensation circuit 40. The differential pair circuit includes bipolar transistors BP1 and BP2, which are transistors of a differential pair, and a current source IS. Resistors are also provided between emitters of the bipolar transistors BP1 and BP2 and the current source IS. For example, in FIG. 5, a reference voltage VL is input to a base of the bipolar transistor BP1. Accordingly, a current IL flows between a collector and the emitter of the bipolar transistor BP1. The temperature detection voltage VTS is input to a base of the bipolar transistor BP2. A current IQ, which is a collector current of the bipolar transistor BP2, is extracted from a current extraction port.

Figure 6:
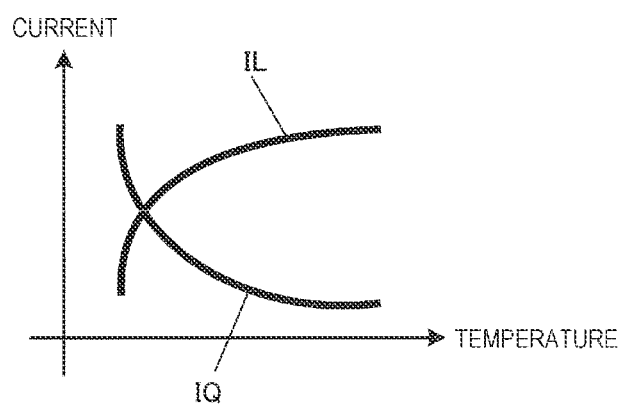
FIG. 6 is a graph illustrating an operation of the differential pair circuit.

In the differential pair circuit in FIG. 5, when a current flowing through the current source IS is defined as IRF, a relation of IRF=IL+IQ is established. Therefore, when the current IQ decreases, the current IL increases. Conversely, when the current IQ increases, the current IL decreases. For example, in a case where the temperature detection voltage VTS has a negative temperature characteristic that the voltage decreases with respect to an increase in temperature, as illustrated in FIG. 6, as the temperature increases, the current IQ flowing through the bipolar transistor BP2 to whose base the temperature detection voltage VTS is input decreases. Accordingly, based on the relation of IRF=IL+IQ, the current IL increases.

In the differential pair circuit in FIG. 5, the currents satisfy IQ=IL at a point when the voltages satisfy VL=VTS. Therefore, a point of changing the current IQ can be set by setting the reference voltage VL, whereby a characteristic curve of a function current for the temperature compensation can be set. In a use temperature range in which the current IQ is increased, the current IL is small. In a temperature range in which the current IQ is not used, the current IQ is reduced, and thus the current IL is increased. Since the current IL is a current that is discarded without being extracted from the current extraction port, when the current IL is increased, power is wasted.

Figure 7:
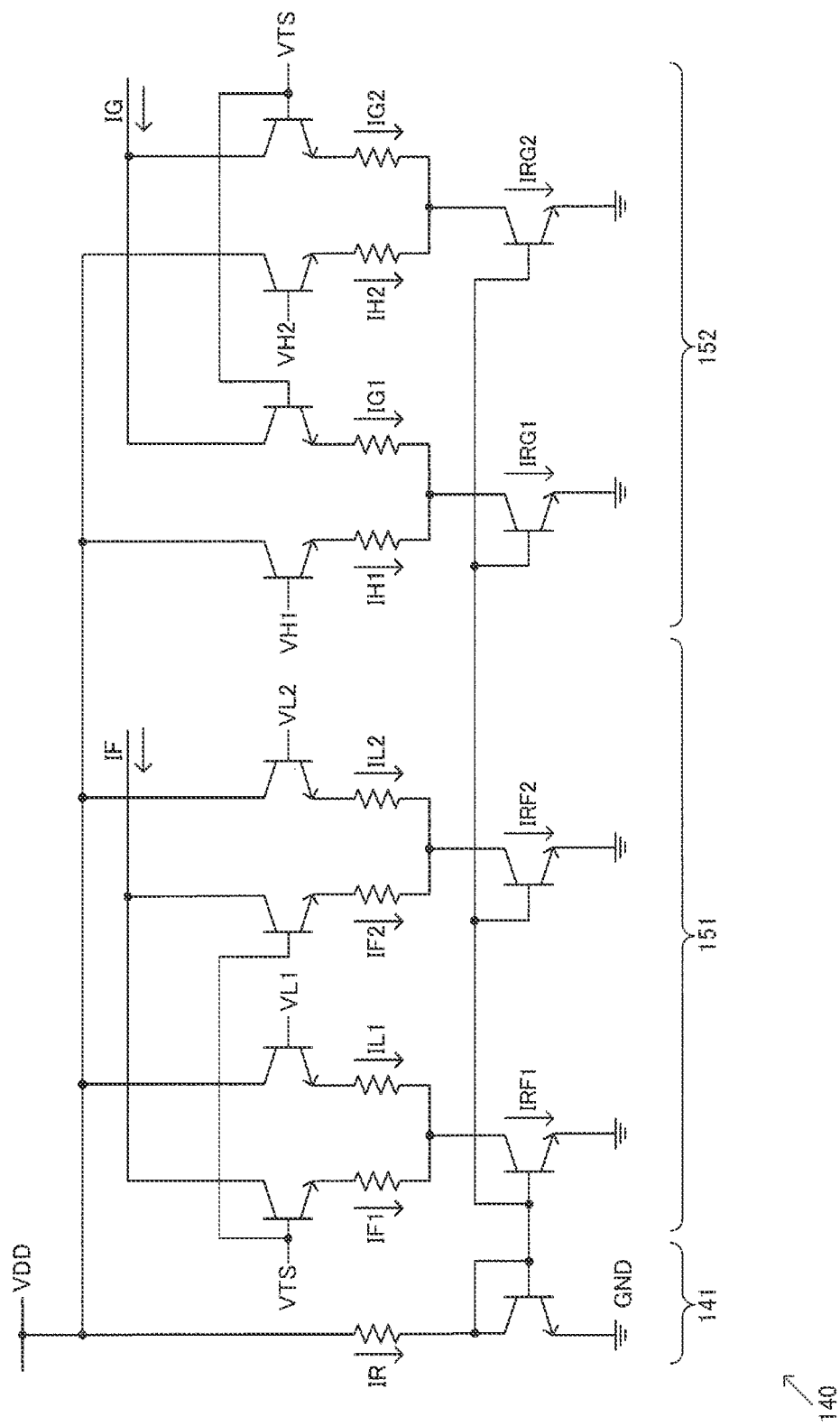
FIG. 7 is a diagram illustrating a configuration example of a first comparative example of the embodiment.

FIG. 7 is a diagram illustrating a configuration example of a temperature compensation circuit 140 according to a first comparative example of the embodiment. The temperature compensation circuit 140 includes a reference current generation circuit 141, a first compensation circuit 151, and a second compensation circuit 152. The reference current generation circuit 141 generates a reference current IR. The first compensation circuit 151 performs temperature compensation for the oscillation frequency in the first temperature range, and the second compensation circuit 152 performs temperature compensation for the oscillation frequency in the second temperature range. The first compensation circuit 151 and the second compensation circuit 152 include a plurality of differential pair circuits described with reference to FIG. 5. Reference currents IRF1 and IRF2 obtained by mirroring the reference current IR flow through the differential pair circuits of the first compensation circuit 151. Reference currents IRG1 and IRG2 obtained by mirroring the reference current IR flow through the differential pair circuits of the second compensation circuit 152. Then, a current IF=IF1+IF2 for temperature compensation in the first temperature range is generated by the first compensation circuit 151, and a current IG=IG1+IG2 for temperature compensation in the second temperature range is generated by the second compensation circuit 152. Since the reference current IR is a constant current, the reference current IRF1=IF1+IL1 and the reference current IRF2=IF2+IL2, which flow through the differential pair circuits of the first compensation circuit 151 respectively, are also constant currents having constant current values. The reference current IRG1=IG1+IH1 and the reference current IRG2=IG2+IH2, which flow through the differential pair circuits of the second compensation circuit 152 respectively, are also constant currents having constant current values.

In the first temperature range on the low temperature side, the current IF=IF1+IF2 increases while the current IG=IG1+IG2 decreases. When the current IG=IG1+IG2 is decreased, since a relation that IRG1=IG1+IH1 and IRG2=IG2+IH2 are constant currents is established as illustrated in FIG. 6, the currents IH1 and IH2 are increased. Therefore, in the first temperature range on the low temperature side, the currents IH1 and IH2 flowing in the second compensation circuit 152 used for the second temperature range are increased, and thus power is consumed wastefully.

On the other hand, in the second temperature range on the high temperature side, the current IG=IG1+IG2 increases while the current IF=IF1+IF2 decreases. When the current IF=IF1+IF2 is decreased, since a relation that IRF1=IF1+IL1 and IRF2=IF2+IL2 are constant currents is established as illustrated in FIG. 6, the currents IL1 and IL2 are increased. Therefore, in the second temperature range on the high temperature side, the currents IL1 and IL2 flowing in the first compensation circuit 151 used for the first temperature range are increased, and thus power is consumed wastefully. As described above, in the temperature compensation circuit 140 of the first comparative example in FIG. 7, at a temperature in the first temperature range on the low temperature side, an unnecessary current may flow in the second compensation circuit 152 used for the second temperature range and power may be consumed. At a temperature in the second temperature range on the high temperature side, an unnecessary current may flow in the first compensation circuit 151 used for the first temperature range and power may be consumed.

Figure 8:
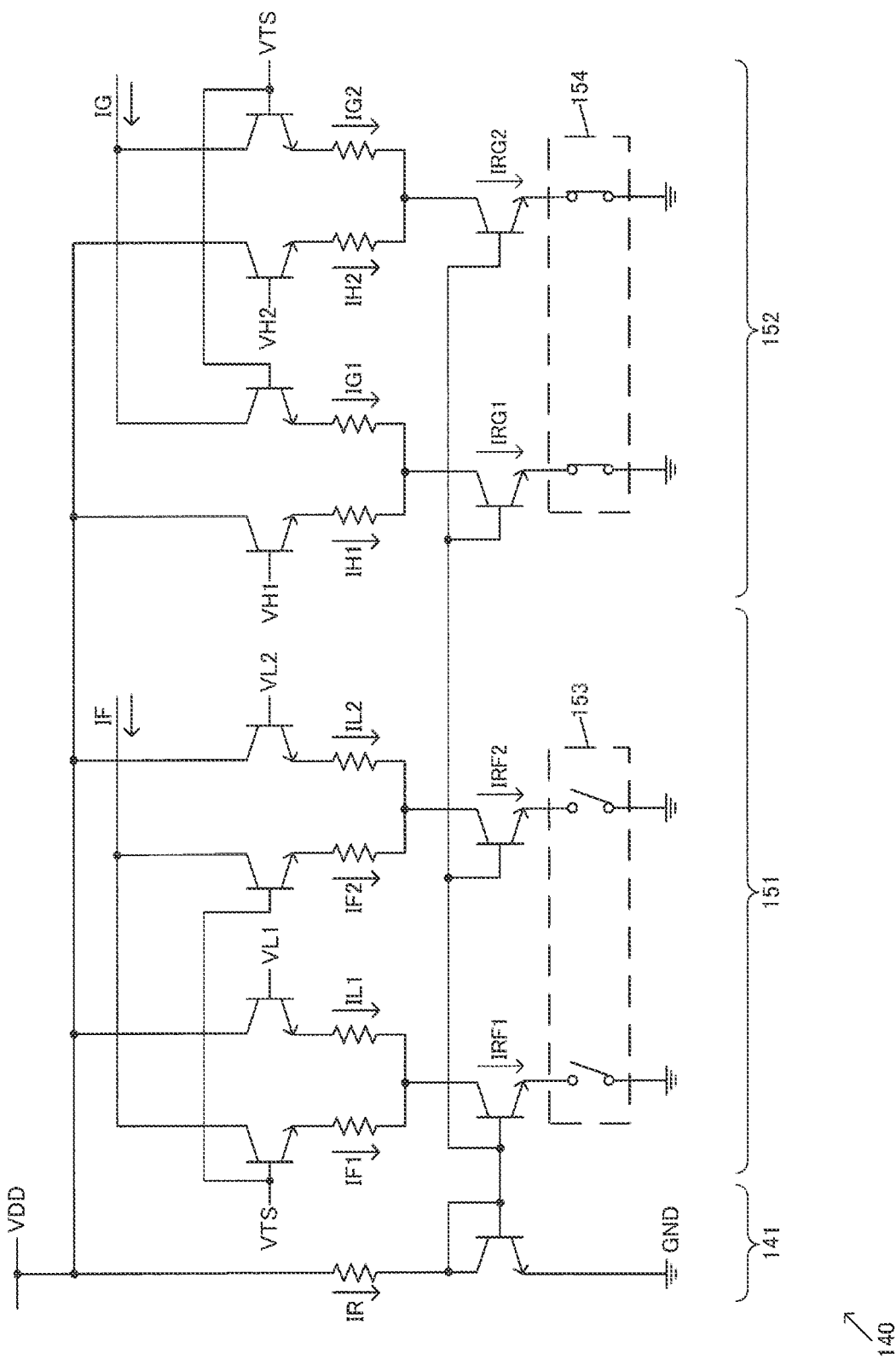
FIG. 8 is a diagram illustrating a configuration example of a second comparative example of the embodiment.

FIG. 8 is a diagram illustrating a configuration example of the temperature compensation circuit 140 according to a second comparative example in which the problem of the first comparative example in FIG. 7 is solved. In FIG. 8, switch circuits 153 and 154 are added to the first comparative example in FIG. 7. In the first temperature range, the switch circuit 153 is turned on and the switch circuit 154 is turned off. Accordingly, it is possible to prevent an increase in power consumption caused due to unnecessary currents IH1 and IH2 flowing in the second compensation circuit 152. On the other hand, in the second temperature range, the switch circuit 153 is turned off and the switch circuit 154 is turned on. Accordingly, it is possible to prevent an increase in power consumption caused due to unnecessary currents IL1 and IL2 flowing in the first compensation circuit 151.

Figure 9:
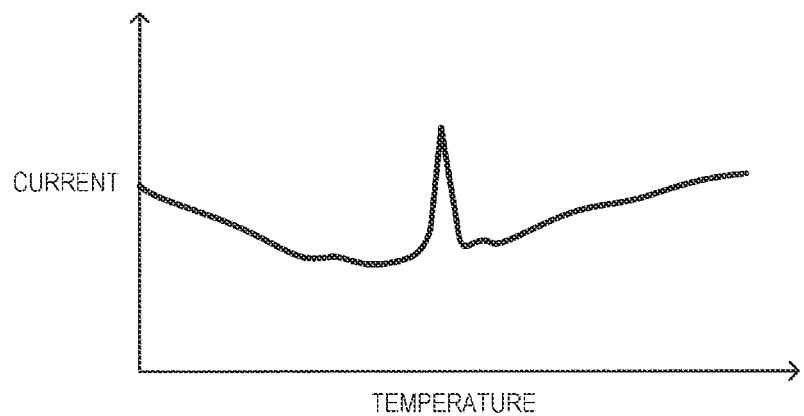
FIG. 9 is a graph illustrating a problem of the second comparative example.

However, in the second comparative example in FIG. 8, as illustrated in FIG. 9, at temperatures in the vicinity of a boundary between the first temperature range and the second temperature range, noise is generated due to switching between on and off of the switch circuits 153 and 154. When such noise is generated, a noise characteristic deteriorates such as that of phase noise of a clock signal output from the oscillator. For example, even when a method of slowly switching on and off the switch circuits 153 and 154 is employed, a gain at the time of switching of the transistor is large, and the deterioration of the noise characteristic cannot be avoided.

Therefore, in the embodiment, the temperature compensation circuit 40 configured as illustrated in FIG. 3 is employed. In FIG. 3, as illustrated in FIG. 4, the first reference current generation circuit 41 reduces the first reference current IRA as the temperature rises. In addition, the second reference current generation circuit 42 reduces the second reference current IRB as the temperature drops. The first compensation circuit 51 generates the first current IA for performing the temperature compensation for the oscillation frequency in the first temperature range on the low temperature side, based on the first reference current IRA that decreases according to an increase in temperature. On the other hand, the second compensation circuit 52 generates the second current IB for performing the temperature compensation for the oscillation frequency in the second temperature range on the high temperature side, based on the second reference current IRB that decreases according to a decrease in temperature.

For example, reference currents IRA1 and IRA2 obtained by mirroring the first reference current IRA flow through the differential pair circuits constituting the first compensation circuit 51. As described with reference to FIGS. 5 and 6, a relation of IRA1=IA1+IL1 and IRA2=IA2+IL2 is established. Therefore, as illustrated in FIG. 4, when the first reference current IRA decreases as the temperature rises, IRA1=IA1+IL1 and IRA2=IA2+IL2 also decrease. Therefore, in the second temperature range on the high temperature side, IRA1=IA1+IL1 and IRA2=IA2+IL2, which are currents flowing through the first compensation circuit 51, are sufficiently small. Accordingly, when a temperature is in the second temperature range, a current is prevented from flowing wastefully through the first compensation circuit 51 used for the first temperature range, and the power consumption can be reduced as compared with the first comparative example in FIG. 7. As illustrated in FIG. 4, when the second reference current IRB decreases as the temperature drops, IRB1=IB1+IH1 and IRB2=IB2+IH2 also decrease. Therefore, in the first temperature range on the low temperature side, IRB1=IB1+IH1 and IRB2=IB2+IH2, which are currents flowing through the second compensation circuit 52, are sufficiently small. Accordingly, when the temperature is in the first temperature range, a current is prevented from flowing wastefully through the second compensation circuit 52 used for the second temperature range, and the power consumption can be reduced as compared with the first comparative example in FIG. 7. Further, in the vicinity of the boundary between the first temperature range and the second temperature range, since switch noise as in the second comparative example in FIG. 8 is not generated, deterioration of a noise characteristic of a clock signal caused by the switch noise can be prevented. Therefore, according to the circuit device 20 in the embodiment, it is possible to achieve both a reduction in power consumption and prevention of deterioration of the noise characteristic at the same time.

Next, a detailed circuit configuration of the temperature compensation circuit 40 in FIG. 3 will be described. The first compensation circuit 51 includes a differential pair circuit having bipolar transistors BA2, BA3, and BA4 and resistors, and a differential pair circuit having bipolar transistors BA5, BA6, and BA7 and resistors. The bipolar transistors BA2 and BA3 are transistors constituting a differential pair, the temperature detection voltage VTS that is a temperature detection signal is input to a base of the bipolar transistor BA2, and a reference voltage VL1 is input to a base of the bipolar transistor BA3. The bipolar transistor BA4 is a transistor constituting a current source, and the reference current IRA1 obtained by mirroring the first reference current IRA flows therethrough. Similarly, the bipolar transistors BA5 and BA6 are transistors constituting a differential pair, the temperature detection voltage VTS is input to a base of the bipolar transistor BA5, and a reference voltage VL2 is input to a base of the bipolar transistor BA6. The bipolar transistor BA7 is a transistor constituting a current source, and the reference current IRA2 obtained by mirroring the first reference current IRA flows therethrough.

The second compensation circuit 52 includes a differential pair circuit having bipolar transistors BB2, BB3, and BB4 and resistors, and a differential pair circuit having bipolar transistors BB5, BB6, and BB7 and resistors. The bipolar transistors BB2 and BB3 are transistors constituting a differential pair, the temperature detection voltage VTS is input to a base of the bipolar transistor BB3, and a reference voltage VH1 is input to a base of the bipolar transistor BB2. The bipolar transistor BB4 is a transistor constituting a current source, and a reference current IRB1 obtained by mirroring the second reference current IRB flows therethrough. Similarly, the bipolar transistors BB5 and BB6 are transistors constituting a differential pair, the temperature detection voltage VTS is input to a base of the bipolar transistor BB6, and a reference voltage VH2 is input to a base of the bipolar transistor BB5. The bipolar transistor BB7 is a transistor constituting a current source, and a reference current IRB2 obtained by mirroring the second reference current IRB flows therethrough.

The temperature detection voltage VTS used in the first compensation circuit 51 and the temperature detection voltage VTS used in the second compensation circuit 52 may have, for example, temperature characteristics of the same polarity such as a negative temperature characteristic, and may have different voltage levels or the like.

Here, the temperature detection voltage VTS, which is a temperature detection signal, has, for example, a negative temperature characteristic, and the voltage decreases as the temperature rises. The reference voltages VL1 and VL2 are voltages for setting, for example, a point at which a characteristic of a function current for temperature compensation changes in the first temperature range on the low temperature side. The reference voltages VH1 and VH2 are voltages for setting, for example, a point at which a characteristic of a function current for temperature compensation changes in the second temperature range on the high temperature side.

According to the temperature compensation circuit 40 having such a configuration, in the first temperature range on the low temperature side, the first compensation circuit 51 can generate, as a function current, the first current IA=IA1+IA2 having the characteristics illustrated in FIG. 4 using the first reference current IRA that decreases according to an increase in temperature. The subsequent current-voltage conversion circuit 59 illustrated in FIG. 2 performs current-voltage conversion on the function current to output the temperature compensation voltage VCP to the oscillation circuit 30, and the capacitance of the variable capacitance circuit 32 is controlled according to, for example, the temperature compensation voltage VCP, whereby the temperature compensation for the oscillation frequency in the first temperature range can be implemented. On the other hand, in the second temperature range on the high temperature side, the second compensation circuit 52 can generate, as a function current, the second current IB=IB1+IB2 having the characteristics illustrated in FIG. 4 using the second reference current IRB that decreases according to a decrease in temperature. The current-voltage conversion circuit 59 performs current-voltage conversion on the function current to output the temperature compensation voltage VCP to the oscillation circuit 30, and the capacitance of the variable capacitance circuit 32 is controlled according to, for example, the temperature compensation voltage VCP, whereby the temperature compensation for the oscillation frequency in the second temperature range can be implemented.

As described above, the first compensation circuit 51 in FIG. 3 includes a first differential pair circuit. The first differential pair circuit includes first differential pair transistors a current flowing through one of which is controlled according to a temperature detection signal, and a first current source transistor that flows a reference current obtained by mirroring the first reference current IRA through the first differential pair transistors. The second compensation circuit 52 includes a second differential pair circuit. The second differential pair circuit includes second differential pair transistors a current flowing through one of which is controlled according to a temperature detection signal, and a second current source transistor that flows a reference current obtained by mirroring the second reference current IRB through the second differential pair transistors.

Here, the first differential pair circuit is a differential pair circuit including the bipolar transistors BA2, BA3, and BA4, or a differential pair circuit including the bipolar transistors BA5, BA6, and BA7. The first differential pair transistors of the first differential pair circuit are the bipolar transistors BA2 and BA3 or the bipolar transistors BA5 and BA6. For example, the bipolar transistor BA2 or the bipolar transistor BA5, which is one transistor of the first differential pair transistors, is controlled in current based on the temperature detection voltage VTS that is a temperature detection signal. The first current source transistor is the bipolar transistor BA4 or the bipolar transistor BA7. For example, the bipolar transistor BA4 is a current source transistor that flows the reference current IRA1 obtained by mirroring the first reference current IRA through the bipolar transistors BA2 and BA3 that are the differential pair transistors. The bipolar transistor BA7 is a current source transistor that flows the reference current IRA2 obtained by mirroring the first reference current IRA through the bipolar transistors BA5 and BA6 that are the differential pair transistors.

The second differential pair circuit is a differential pair circuit including the bipolar transistors BB2, BB3, and BB4, or a differential pair circuit including the bipolar transistors BB5, BB6, and BB7. The second differential pair transistors of the second differential pair circuit are the bipolar transistors BB2 and BB3 or the bipolar transistors BB5 and BB6.

For example, the bipolar transistor BB3 or the bipolar transistor BB6, which is one transistor of the second differential pair transistors, is controlled in current based on the temperature detection voltage VTS that is a temperature detection signal. The second current source transistor is the bipolar transistor BB4 or the bipolar transistor BB7. For example, the bipolar transistor BB4 is a current source transistor that flows the reference current IRB1 obtained by mirroring the second reference current IRB through the bipolar transistors BB2 and BB3 that are the differential pair transistors. The bipolar transistor BB7 is a current source transistor that flows the reference current IRB2 obtained by mirroring the second reference current IRB through the bipolar transistors BB5 and BB6 that are the differential pair transistors.

With such a configuration, the first current IA for the temperature compensation in the first temperature range can be generated by controlling a current flowing through one transistor of the first differential pair transistors based on a temperature detection signal while causing a reference current obtained by mirroring the first reference current IRA to flow through the first differential pair transistors of the first compensation circuit 51. Further, the second current IB for the temperature compensation in the second temperature range can be generated by controlling a current flowing through one transistor of the second differential pair transistors based on a temperature detection signal while causing a reference current obtained by mirroring the second reference current IRB to flow through the second differential pair transistors of the second compensation circuit 52.

The first reference current generation circuit 41 includes a first bipolar transistor BA1 of an npn type, and a first resistor RA. In the first bipolar transistor BA1, a collector and a base thereof are coupled to each other, and an emitter thereof is coupled to a low-potential-side power supply node. The low-potential-side power supply node is, for example, a GND node. The first resistor RA is provided between a high-potential-side power supply node and the first bipolar transistor BA1, and one end of the first resistor RA on a high-potential-side power supply node side is set to a voltage having a negative temperature characteristic. The high-potential-side power supply node is, for example, a VDD node. The one end of the first resistor RA on the VDD node side is a node N1 in FIG. 3, and the node N1 is set to a voltage having a negative temperature characteristic. Further, the first bipolar transistor BA1 of an npn type is a diode-coupled bipolar transistor whose collector and base are coupled to each other, and a voltage of a node N2 of the collector is set to VBE that is a base-to-emitter voltage of the first bipolar transistor BA1. In this way, the node N1 at one end of the first resistor RA is set to the voltage having a negative temperature characteristic, and the node N2 at the other end of the first resistor RA is set to the voltage VBE, whereby the first reference current IRA having a negative temperature characteristic can flow through the first resistor RA. Accordingly, the first reference current generation circuit 41 can generate the first reference current IRA that decreases according to an increase in temperature.

The first reference current generation circuit 41 includes a first operational amplifier OPA and a first transistor TA of a p-type. The first operational amplifier OPA and the first transistor TA constitute a first variable resistance circuit 46. The temperature detection voltage VTS having a negative temperature characteristic is input to a non-inverting input terminal of the first operational amplifier OPA. The first transistor TA is provided between the VDD, which is the high-potential-side power supply node, and the first resistor RA. An output of the first operational amplifier OPA is input to a gate of the first transistor TA, and a drain of the first transistor TA is coupled to an inverting input terminal of the first operational amplifier OPA and one end of the first resistor RA. According to such a configuration, the node N1 of the drain of the first transistor TA can be set to the temperature detection voltage VTS having a negative temperature characteristic by virtual ground of the first operational amplifier OPA. For example, when the temperature detection voltage VTS changes due to a temperature change, the gate of the first transistor TA is controlled by the first operational amplifier OPA, whereby on-resistance of the first transistor TA changes and the node N1 of the drain of the first transistor TA is set to the temperature detection voltage VTS. Since the node N1 at one end of the first resistor RA is set to the temperature detection voltage VTS having a negative temperature characteristic in this way, the first reference current generation circuit 41 can generate the first reference current IRA having a negative temperature characteristic.

The second reference current generation circuit 42 includes a second bipolar transistor BB1 of an npn type and a second resistor RB. In the second bipolar transistor BB1, a collector and a base thereof are coupled to each other, and an emitter thereof is coupled to the GND node that is a low-potential-side power supply node. The second resistor RB is provided between the VDD node, which is the high-potential-side power supply node, and the second bipolar transistor BB1, and one end of the second resistor RB on the VDD node side is set to a voltage having a positive temperature characteristic. The one end of the second resistor RB on the VDD node side is a node N3 in FIG. 3, and the node N3 is set to a voltage having a positive temperature characteristic. Further, the second bipolar transistor BB1 of an npn type is a diode-coupled bipolar transistor whose collector and base are coupled to each other, and a voltage of a node N4 of the collector is set to VBE that is a base-to-emitter voltage of the second bipolar transistor BB1. In this way, the node N3 at one end of the second resistor RB is set to the voltage having a positive temperature characteristic, and the node N4 at the other end of the second resistor RB is set to the voltage VBE, whereby the second reference current IRB having a positive temperature characteristic can flow through the second resistor RB. Accordingly, the second reference current generation circuit 42 can generate the second reference current IRB that decreases according to a decrease in temperature.

The second reference current generation circuit 42 includes a second operational amplifier OPB and a second transistor TB of a p-type. The second operational amplifier OPB and the second transistor TB constitute a second variable resistance circuit 47. A temperature detection voltage VTS2 having a positive temperature characteristic is input to a non-inverting input terminal of the second operational amplifier OPB. The second transistor TB is provided between the VDD node, which is the high-potential-side power supply node, and the second resistor RB. An output of the second operational amplifier OPB is input to a gate of the second transistor TB, and a drain of the second transistor TB is coupled to an inverting input terminal of the second operational amplifier OPB and one end of the second resistor RB. According to such a configuration, the node N3 of the drain of the second transistor TB can be set to the temperature detection voltage VTS2 having a positive temperature characteristic by virtual ground of the second operational amplifier OPB. For example, when the temperature detection voltage VTS2 changes due to a temperature change, the gate of the second transistor TB is controlled by the second operational amplifier OPB, whereby on-resistance of the second transistor TB is changed and the node N3 of the drain of the second transistor TB is set to the temperature detection voltage VTS2. Since the node N3 at one end of the second resistor RB is set to the temperature detection voltage VTS2 having a positive temperature characteristic in this way, the second reference current generation circuit 42 can generate the second reference current IRB having a positive temperature characteristic.

As described above, in FIG. 3, in the temperature compensation circuit 40 of the circuit device 20 that oscillates the resonator 10, a reference current source of the first compensation circuit 51 and the second compensation circuit 52 that generate a function current for temperature compensation is divided into the first reference current generation circuit 41 on a low temperature side and the second reference current generation circuit 42 on a high temperature side. The first transistor TA of MOS is provided in the first reference current generation circuit 41 that is a reference current source on the low temperature side, and the first transistor TA is controlled by the first operational amplifier OPA to which the temperature detection voltage VTS having a negative temperature characteristic is input. On the other hand, the second transistor TB of MOS is provided in the second reference current generation circuit 42 that is a reference current source on the high temperature side, and the second transistor TB is controlled by the second operational amplifier OPB to which the temperature detection voltage VTS2 having a positive temperature characteristic is input. Accordingly, it is possible to reduce current consumption while preventing an increase in circuit area and an increase in noise.

The configuration of the temperature compensation circuit 40 is not limited to that illustrated in FIG. 3, and various modifications can be made such as replacing the bipolar transistor of the first compensation circuit 51, the second compensation circuit 52, the first reference current generation circuit 41, and the second reference current generation circuit 42 with a MOS transistor. In this case, a diode-coupled transistor used for a current source can be implemented by coupling a drain and a gate of the MOS transistor. Further, in the embodiment, the case where two temperature ranges such as the first temperature range and the second temperature range are set has been described as an example. Alternatively, three or more temperature ranges may be set, and a reference current generation circuit may be provided for each of the three or more temperature ranges.

Figure 10:
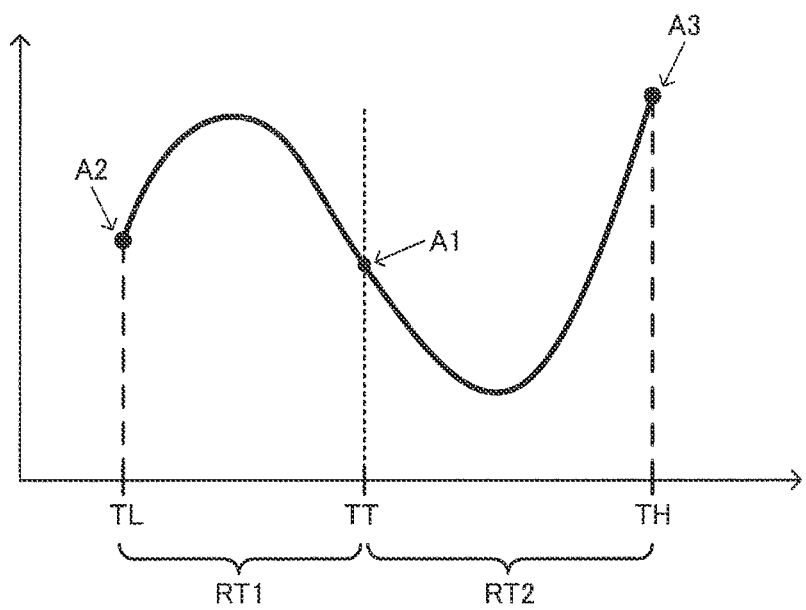
FIG. 10 is a graph illustrating a frequency-temperature characteristic and a temperature range.

FIG. 10 is a graph illustrating a frequency-temperature characteristic and a temperature range. A temperature characteristic in FIG. 10 is a temperature characteristic of the oscillation frequency in a case where temperature compensation is not performed, and corresponds to, for example, a temperature characteristic of the AT-cut resonator 10. In FIG. 2, a capacitance change characteristic of the variable capacitance circuit 32 of the oscillation circuit 30 with respect to the temperature compensation voltage VCP that is a frequency control voltage is a positive characteristic. Accordingly, since a change characteristic of the oscillation frequency of the oscillation circuit 30 with respect to the temperature compensation voltage VCP is a negative characteristic, the temperature compensation voltage VCP and a function current used to generate the temperature compensation voltage VCP have the same temperature characteristic as illustrated in FIG. 10.

In FIG. 10, TT is a typical temperature, and is, for example, 25° C. This temperature TT corresponds to a temperature at an inflection point indicated by A1 of a temperature characteristic of a cubic function in FIG. 10. TL is the lowest operating temperature in a product specification, and is, for example, −40° C. TH is the maximum operating temperature in the product specification, and is, for example, 110° C. In FIG. 10, a range of the temperatures TL to TT is defined as a first temperature range RT1, and a range of the temperatures TT to TH is defined as a second temperature range RT2. For example, temperature compensation in the first temperature range RT1 is performed by the first compensation circuit 51, and temperature compensation in the second temperature range RT2 is performed by the second compensation circuit 52.

As illustrated in FIG. 10, the second temperature range RT2 on a high temperature side is wider than the first temperature range RT1 on a low temperature side. Therefore, in the second temperature range RT2 on the high temperature side, it is necessary to adjust a function current in a wider range than in the first temperature range RT1 on the low temperature side. Therefore, when adjusting the function current based on the reference current IR from one reference current generation circuit 141 as in the comparative example in FIG. 7, it is necessary to increase a current adjustment amount in the second compensation circuit 152 on the high temperature side than in the first compensation circuit 151 on the low temperature side, which causes an increase in circuit area. That is, in FIG. 7, the reference current in each compensation circuit is set according to a size ratio of the bipolar transistor of the current source of the reference current generation circuit 141 and the bipolar transistors of the current sources of the first compensation circuit 151 and the second compensation circuit 152. For example, as will be described later with reference to FIG. 12, when the bipolar transistor of the current source of the reference current generation circuit 141 is a unit transistor, the current source of each of the first compensation circuit 151 and the second compensation circuit 152 is implemented by arranging one or a plurality of unit transistors. Therefore, in the second compensation circuit 152 on the high temperature side where the temperature range is wide and the current adjustment amount is large, the number of unit transistors to be arranged is increased, which causes an increase in circuit area.

In this regard, in the temperature compensation circuit 40 according to the embodiment, unlike the comparative example in FIG. 7, the first reference current generation circuit 41 on the low temperature side and the second reference current generation circuit 42 on the high temperature side are separately provided. Accordingly, the unit transistors serving as the bipolar transistors can be set separately on the low temperature side and the high temperature side. Furthermore, minimum current units set by resistance values of RA and RB can be set separately on the low temperature side and the high temperature side. Therefore, an increase in arrangement area due to an increase in the number of arranged unit transistors as in the comparative example in FIG. 7 can be prevented, and a reduction in the circuit area can be achieved.

Specifically, in the embodiment, in FIG. 3, the resistance value of the second resistor RB of the second reference current generation circuit 42 on the high temperature side is made smaller than the resistance value of the first resistor RA of the first reference current generation circuit 41 on the low temperature side. For example, the reference currents of IRA and IRB increase as the resistance values of RA and RB decrease. Therefore, by making the resistance value of RB smaller than that of RA, even when the unit transistor of the same current source is used, the second reference current IRB can be set to a larger current value than the first reference current IRA. By setting the second reference current IRB to a large current value, it is possible to achieve the adjustment of the function current in the wide second temperature range RT2 as illustrated in FIG. 10 while preventing an increase in circuit area due to the number of arranged unit transistors.

In FIG. 10, the second reference current IRB at an upper limit of the second temperature range RT2 is larger than the first reference current IRA at a lower limit of the first temperature range RT1. The first reference current IRA at the lower limit of the first temperature range RT1 is a current at a point indicated by A2 in FIG. 10. The second reference current IRB at the upper limit of the second temperature range RT2 is a current at a point indicated by A3 in FIG. 10. In this way, the second compensation circuit 52 adjusts the function current in the second temperature range RT2 on the high temperature side that is wider with reference to the point A1 of the typical temperature as compared with the first temperature range RT1 on the low temperature side. Also in this case, in the embodiment, since the first reference current generation circuit 41 on the low temperature side and the second reference current generation circuit 42 on the high temperature side are separately provided, it is possible to achieve appropriate current adjustment in the first temperature range RT1 and the second temperature range RT2 while preventing an increase in circuit area.

Figure 11:
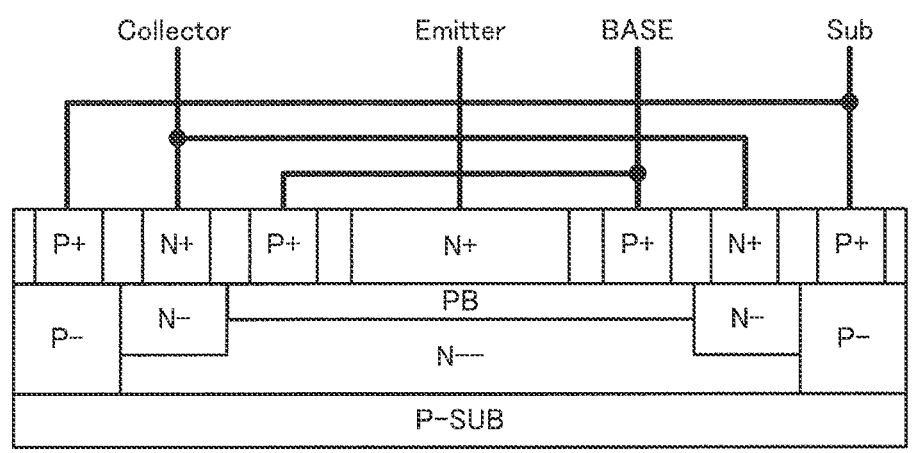
FIG. 11 is a diagram illustrating a cross-sectional structure example of a bipolar transistor.
Figure 12:
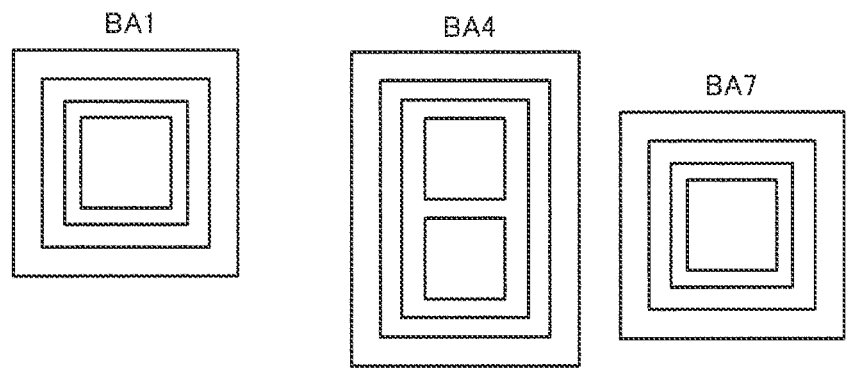
FIG. 12 is a diagram illustrating a layout arrangement example of the bipolar transistor.

FIG. 11 is a diagram illustrating a cross-sectional structure example of a bipolar transistor used in the temperature compensation circuit 40 according to the embodiment. The bipolar transistor in FIG. 11 is a bipolar transistor of an npn type. In a plan view orthogonal to a semiconductor substrate, a region of an emitter is formed by an N+ diffusion region positioned at a center, and a region of a base is formed by a P+ diffusion region in a manner of surrounding the region of the emitter. A region of a collector is formed by an N+ diffusion region in a manner of surrounding the region of the base. FIG. 12 is a diagram schematically illustrating a layout arrangement of the bipolar transistors of BA1, BA4, and BA7 constituting the current sources in FIG. 3. For example, the first bipolar transistor BA1 of the current source of the first reference current generation circuit 41 is implemented by a unit transistor, the bipolar transistor BA4 of the first compensation circuit 51 is implemented by a transistor corresponding to two unit transistors, and the bipolar transistor BA7 is implemented by one unit transistor. In this way, the reference currents IRA1 and IRA2 obtained by mirroring the first reference current IRA can be generated.

Figure 13:
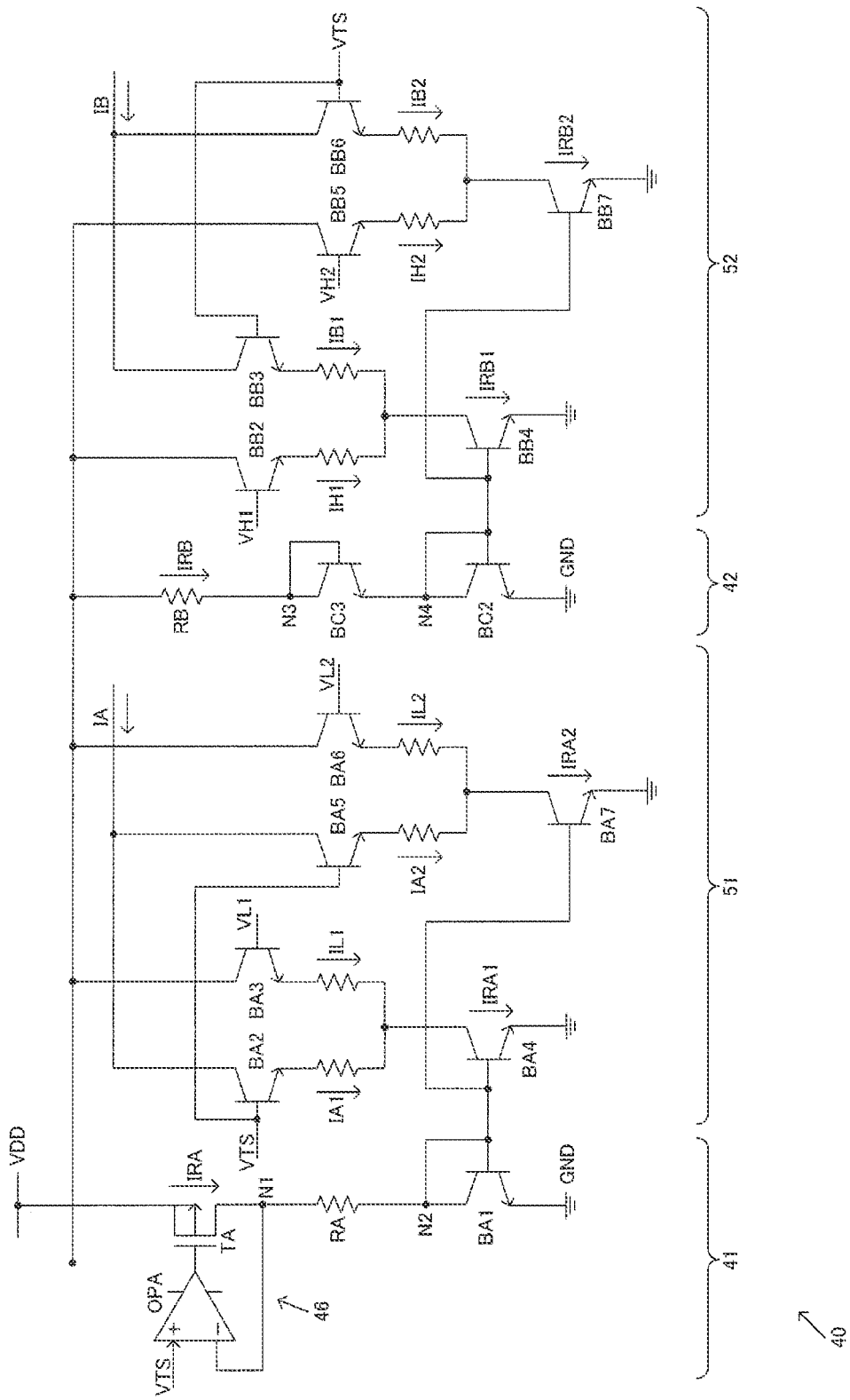
FIG. 13 is a diagram illustrating in detail a second configuration example of the temperature compensation circuit according to the embodiment.

FIG. 13 is a diagram illustrating in detail a second configuration example of the temperature compensation circuit 40 according to the embodiment. The second configuration example in FIG. 13 is different from the first configuration example in FIG. 3 in the configuration of the second reference current generation circuit 42.

Specifically, the second reference current generation circuit 42 in FIG. 13 includes a second bipolar transistor BC2 of an npn type, a third bipolar transistor BC3 of an npn type, and the second resistor RB. In the second bipolar transistor BC2, a collector and a base thereof are coupled to each other, and an emitter thereof is coupled to the GND node that is a low-potential-side power supply node. In the third bipolar transistor BC3, a collector and a base thereof are coupled to each other, and an emitter thereof is coupled to the collector of the second bipolar transistor BC2. The second resistor RB is provided between the VDD node, which is a high-potential-side power supply node, and the third bipolar transistor BC3. For example, one end of the second resistor RB is coupled to the node N3, which is a collector node of the third bipolar transistor BC3, and the other end is coupled to the VDD node.

Figure 14:
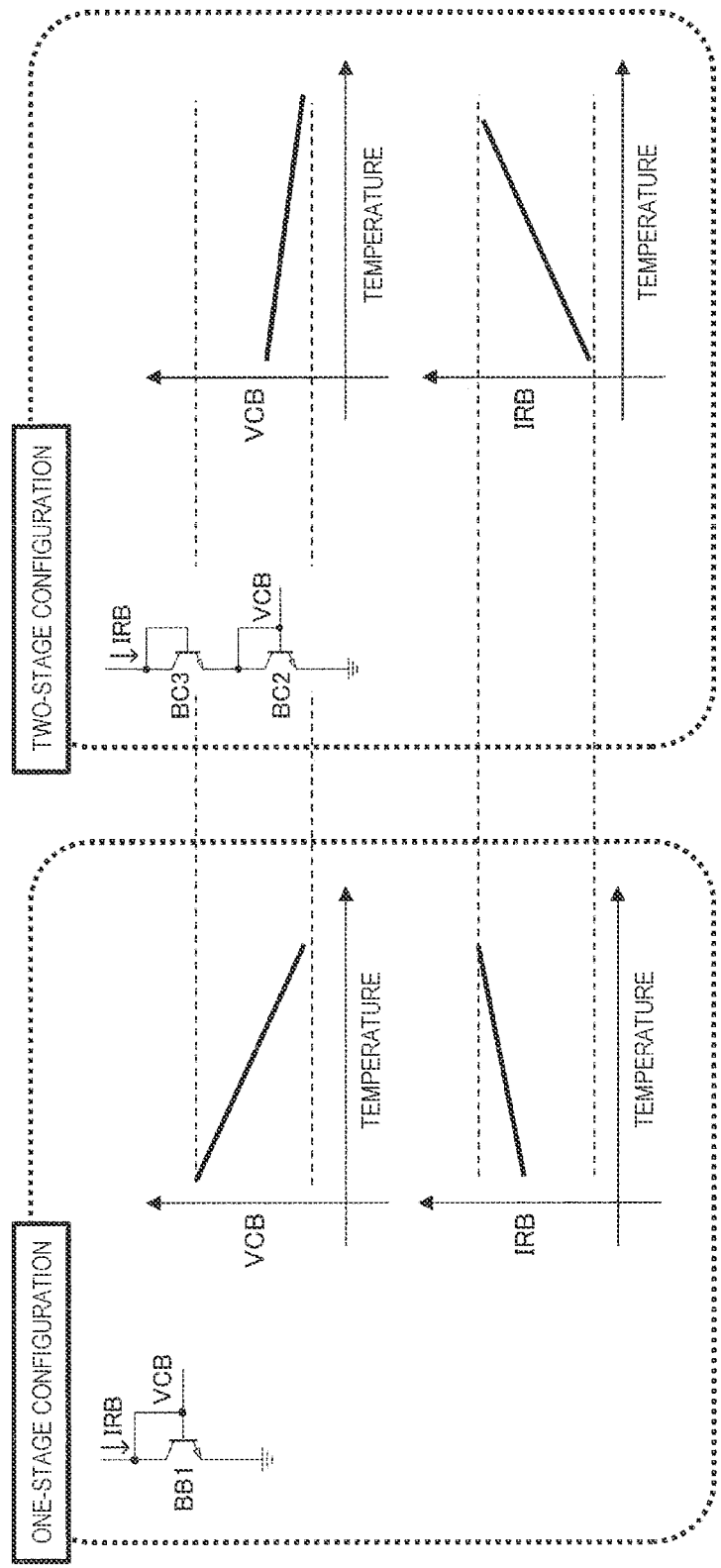
FIG. 14 is an explanatory diagram illustrating a positive temperature characteristic using the bipolar transistor.

As described, the second bipolar transistor BC2 of an npn type is a diode-coupled bipolar transistor whose collector and base are coupled to each other, and a voltage of the node N4 of the collector is set to VBE that is a base-to-emitter voltage of the second bipolar transistor BC2. The third bipolar transistor BC3 of an npn type is a diode-coupled bipolar transistor whose collector and base are coupled, and a voltage of the node N3 of the collector is set to 2×VBE corresponding to a voltage obtained by adding the base-to-emitter voltage of the second bipolar transistor BC2 and a base-to-emitter voltage of the third bipolar transistor BC3. Here, since the voltage VBE corresponds to a diode forward voltage, the voltage VBE has a negative temperature characteristic. Accordingly, the node N3 is set to a voltage having a negative temperature characteristic. Therefore, in the second resistor RB whose one end is coupled to the node N3 and the other end is coupled to the VDD node, a voltage difference between both ends increases as the temperature rises, and thus the second reference current IRB having a positive temperature characteristic flows. Therefore, the second reference current generation circuit 42 can generate the second reference current IRB having a positive temperature characteristic that the current decreases according to a decrease in temperature. For example, FIG. 14 illustrates a temperature characteristic of the second reference current IRB in a case where the bipolar transistor has a one-stage configuration, and a temperature characteristic of the second reference current IRB in a case where the bipolar transistor has a two-stage configuration as illustrated in FIG. 13. By setting the bipolar transistor to have a two-stage configuration, it is possible to generate the second reference current IRB having a positive temperature characteristic with a larger inclination than in the case of the one-stage configuration. Although FIG. 13 illustrates the configuration example in which the number of stages of the bipolar transistor is two, the number of stages of the bipolar transistor may be three or more.

As described, according to the temperature compensation circuit 40 having the configuration in FIG. 13, it is possible to generate the appropriate second reference current IRB having a positive temperature characteristic by increasing the number of stages of the bipolar transistor of the reference current source as compared with the temperature compensation circuit 40 having the configuration in FIG. 3. Since the second operational amplifier OPB and the second transistor TB that are provided in the configuration in FIG. 3 can be omitted, an advantage is exhibited that the appropriate second reference current IRB having a positive temperature characteristic can be generated while preventing an increase in circuit area.

Figure 15:
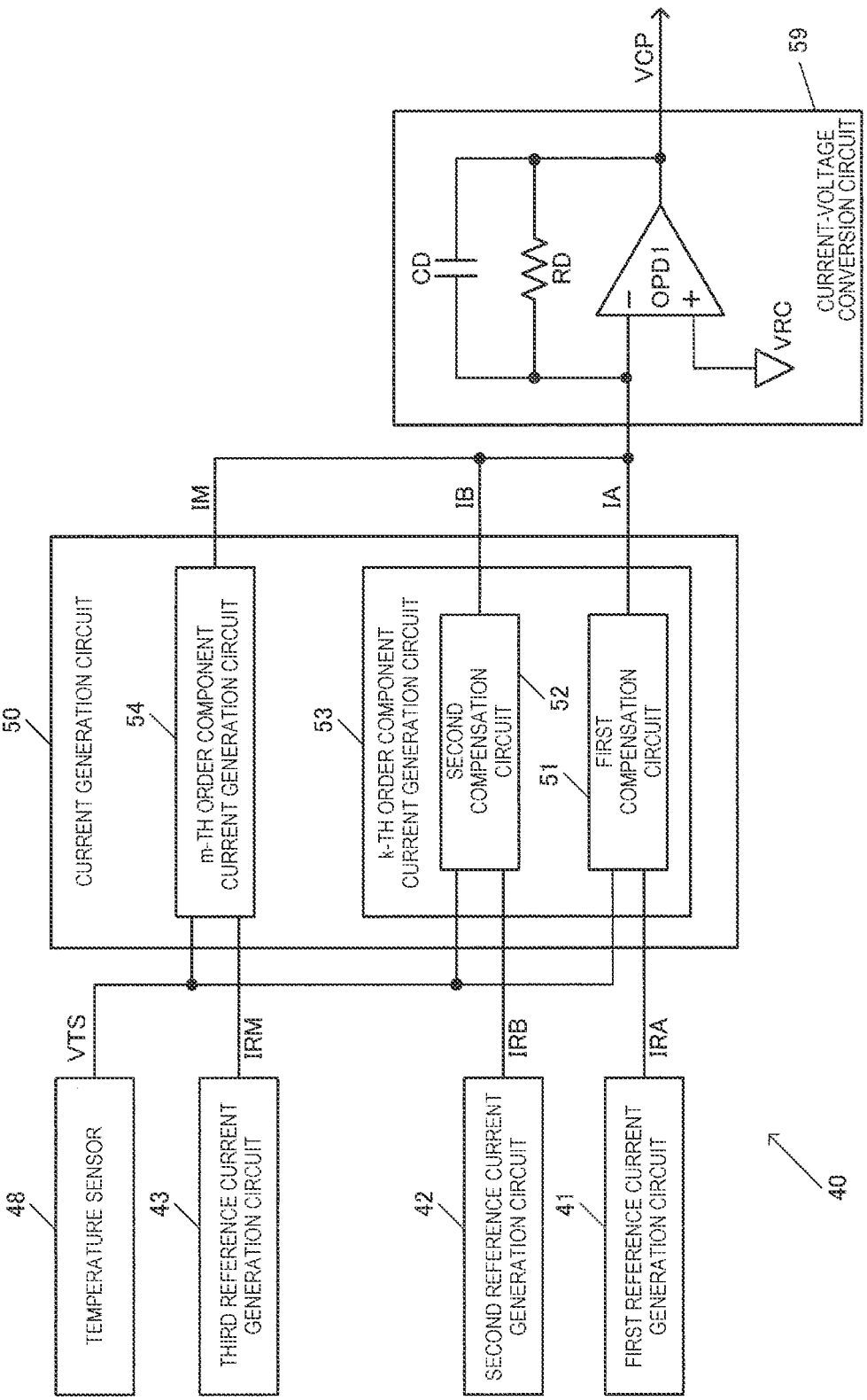
FIG. 15 is a diagram illustrating an overall configuration example of the temperature compensation circuit.

FIG. 15 is a diagram illustrating an overall configuration example of the temperature compensation circuit 40. As illustrated in FIG. 15, the temperature compensation circuit 40 includes the current generation circuit 50 and the current-voltage conversion circuit 59. The current generation circuit 50 generates a function current based on the first current IA and the second current IB. The first current IA is generated by the first compensation circuit 51 based on the first reference current IRA and the temperature detection voltage VTS, and the second current IB is generated by the second compensation circuit 52 based on the second reference current IRB and the temperature detection voltage VTS. That is, a function current including the first current IA and the second current IB is generated. The current-voltage conversion circuit 59 performs current-voltage conversion on the function current including the first current IA and the second current IB, and outputs the temperature compensation voltage VCP to the oscillation circuit 30. Specifically, the current-voltage conversion circuit 59 includes an operational amplifier OPD1 and a feedback circuit element. In the operational amplifier OPD1, a reference voltage VRC is input to a non-inverting input terminal thereof, and an output of the current generation circuit 50 is input to an inverting input terminal thereof. As a feedback circuit element, a resistor RD and a capacitor CD are provided in parallel between an output terminal and the inverting input terminal of the operational amplifier OPD1.

As illustrated in FIG. 15, the temperature compensation circuit 40 is provided with a third reference current generation circuit 43 that generates a third reference current IRM, in addition to the first reference current generation circuit 41 and the second reference current generation circuit 42. The current generation circuit 50 includes a k-th order component current generation circuit 53 and an m-th order component current generation circuit 54. The k-th order component current generation circuit 53 includes the first compensation circuit 51 and the second compensation circuit 52. Here, k>m, in which k and m are integers equal to or greater than 1. The k-th order component current generation circuit 53 generates, as k-th order component currents of a function current, the first current IA generated based on the first reference current IRA and the second current IB generated based on the second reference current IRB. For example, IA+IB is a k-th order component current of the function current. The m-th order component current generation circuit 54 generates IM, which is an m-th order component current of the function current, based on the third reference current IRM generated by the third reference current generation circuit 43. The current-voltage conversion circuit 59 performs current-voltage conversion on the function current including IA+IB, which is the k-th order component current, and IM, which is the m-th order component current, to generate the temperature compensation voltage VCP. In this way, the k-th order component current of the function current is generated based on the first reference current IRA in the first temperature range, and is generated based on the second reference current IRB in the second temperature range. Accordingly, a reduction in power consumption can be achieved. On the other hand, the m-th order component current is not generated for each temperature range but, for example, is generated based on the third reference current IRM in all the temperature ranges. Accordingly, the power consumption of the entire temperature compensation circuit 40 can be reduced.

Specifically, the k-th order component current is a component current having a lower order than the m-th order component current. For example, the k-th order component current is a cubic component current of the function current, and the m-th order component current is a quartic component current or a quintic component current of the function current. For example, in the embodiment, the k-th order component current, which is a low-order component current, is generated in the first temperature range based on the first reference current IRA that decreases according to an increase in temperature, and is generated in the second temperature range based on the second reference current IRB that decreases according to a decrease in temperature.

Accordingly, when the temperature is in one of the first temperature range and the second temperature range, it is possible to prevent a current in the other temperature range from being wastefully consumed, and it is possible to achieve a reduction in power consumption. On the other hand, when a reference current is generated for each of the temperature ranges for the m-th order component current that is a high-order component current, there is a possibility that power consumption in the entire temperature compensation circuit 40 cannot be reduced due to power consumption in an operational amplifier or the like used for generation of the reference current, for example. In this regard, as illustrated in FIG. 15, the m-th order component current, which is a high-order component current, is generated based on the third reference current IRM in all the temperature ranges, so that it is possible to reduce the power consumption in the entire temperature compensation circuit 40.

Specifically, in the current generation circuit 50, a cubic component current generation circuit is provided as the k-th order component current generation circuit 53, and a quartic component current generation circuit and a quintic component current generation circuit are provided as the m-th order component current generation circuit 54. The current generation circuit 50 is also provided with a linear component current generation circuit (not illustrated). The linear component current generation circuit, the cubic component current generation circuit, the quartic component current generation circuit, and the quintic component current generation circuit may be referred to as a linear correction circuit, a cubic correction circuit, a quartic correction circuit, and a quintic correction circuit, respectively. A zero-order correction circuit is implemented by, for example, the temperature sensor 48.

Figure 16:
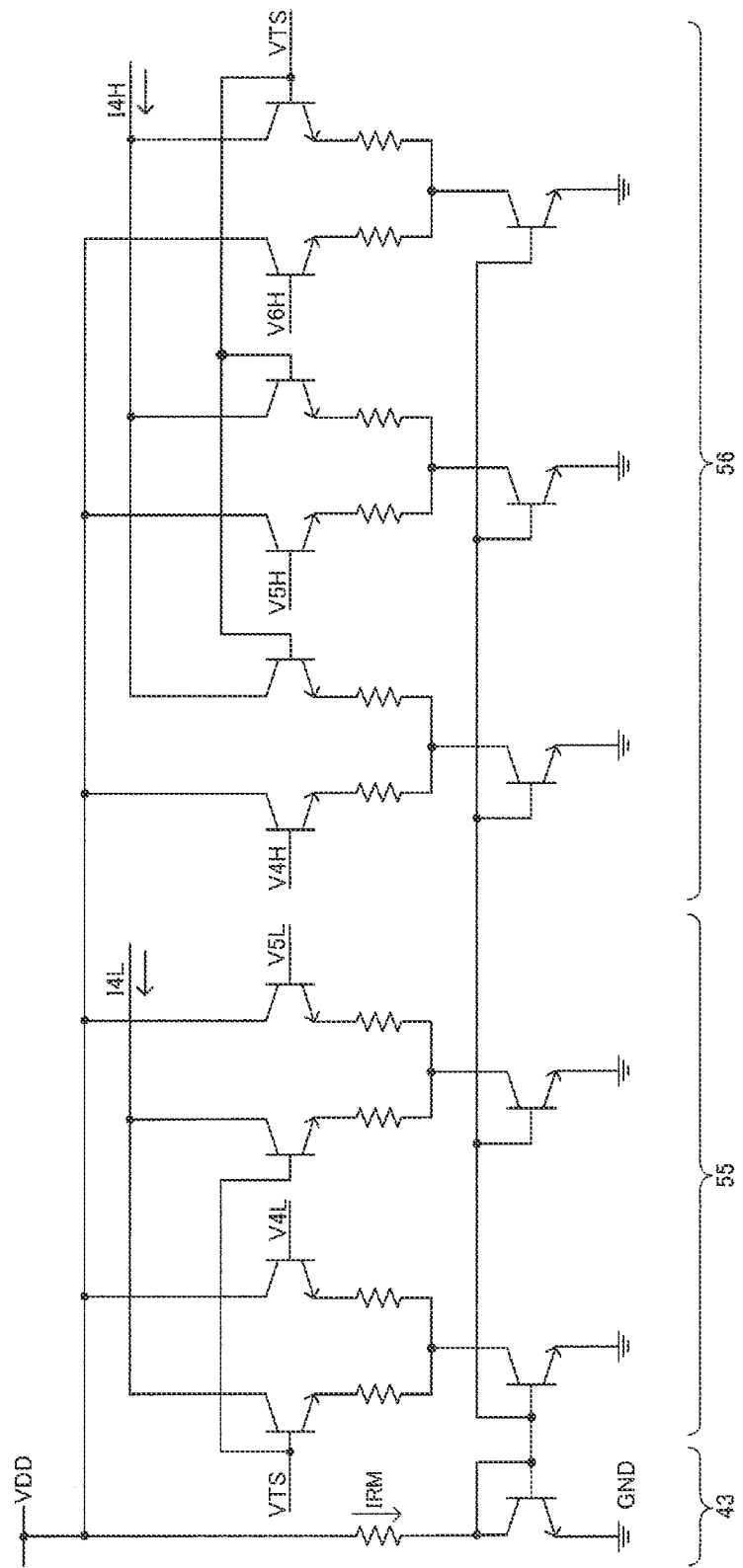
FIG. 16 is a diagram illustrating a configuration example of a quartic component current generation circuit.

For example, FIG. 16 illustrates a configuration example of a quartic component current generation circuit, which is one of the m-th order component current generation circuit 54. In the quartic component current generation circuit, based on a reference current obtained by mirroring the third reference current IRM generated by the third reference current generation circuit 43 used for a quartic component and the temperature detection voltage VTS, a third compensation circuit 55 generates a quartic component current I4L in the first temperature range, and a fourth compensation circuit 56 generates a quartic component current I4H in the second temperature range. As described, in the quartic component current generation circuit in FIG. 16, unlike the cubic component current generation circuit described with reference to FIGS. 3 and 13, in the first temperature range and the second temperature range, the quartic component currents I4L and I4H of the function current are generated based on the third reference current IRM generated by the common third reference current generation circuit 43. In this way, since it is not necessary to provide an operational amplifier or the like provided in the cubic component current generation circuit, a reduction in power consumption can be achieved. That is, since the quartic component current is about ¼ or less of the cubic component current, an effect of reducing power consumption by not providing the operational amplifier or the like is better than an effect of reducing power consumption by providing the reference current generation circuit for each temperature range.

Figure 17:
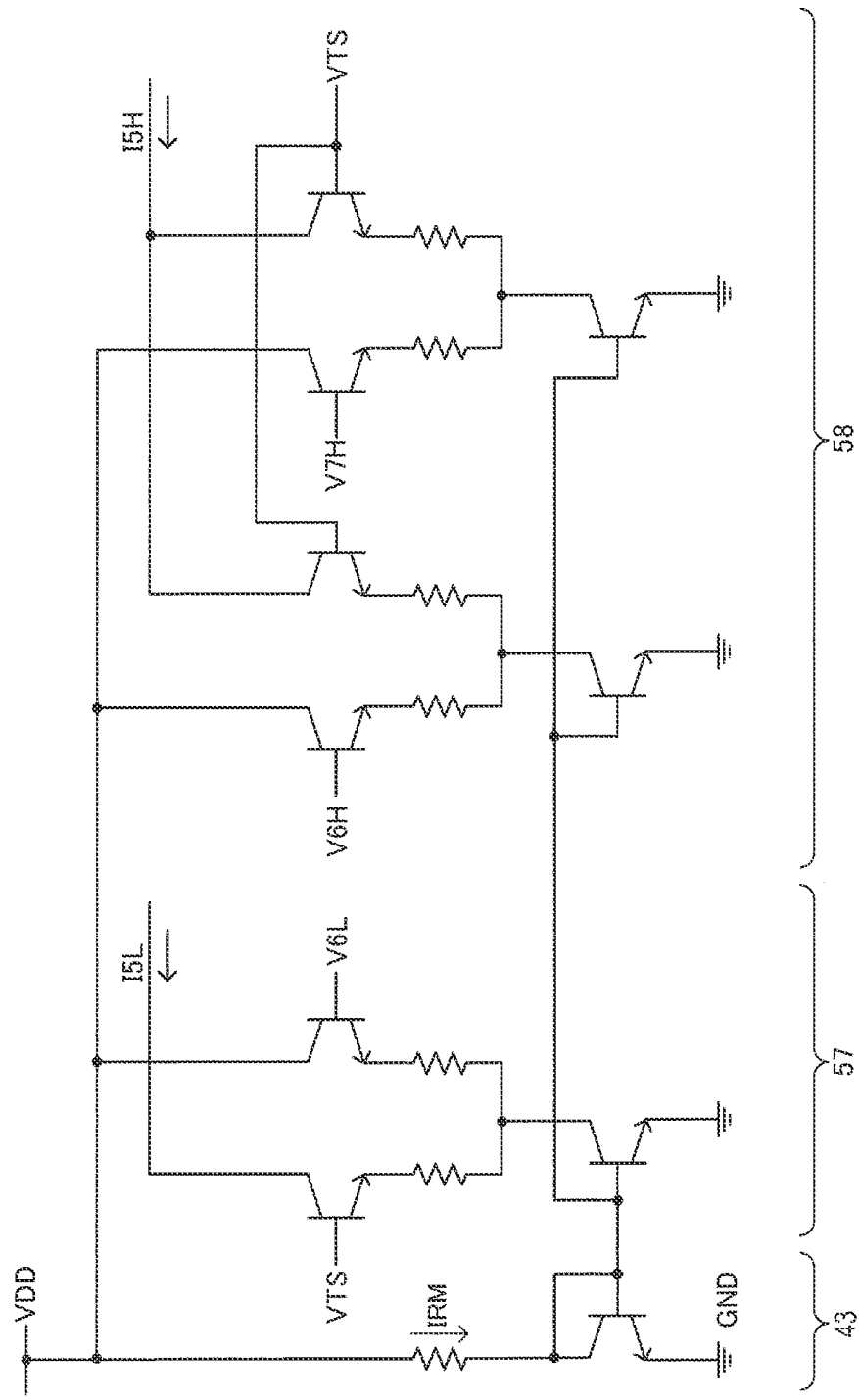
FIG. 17 is a diagram illustrating a configuration example of a quintic component current generation circuit.

FIG. 17 illustrates a configuration example of a quintic component current generation circuit, which is one of the m-th order component current generation circuits 54. In the quintic component current generation circuit, based on a reference current obtained by mirroring the third reference current IRM generated by the third reference current generation circuit 44 used for a quintic component and the temperature detection voltage VTS, a fifth compensation circuit 57 generates a quintic component current I5L in the first temperature range, and a sixth compensation circuit 58 generates a quintic component current I5H in the second temperature range. As described, in the quintic component current generation circuit in FIG. 17, unlike the cubic component current generation circuit described with reference to FIGS. 3 and 13, in the first temperature range and the second temperature range, the quintic component currents I5L and I5H of the function current are generated based on the third reference current IRM generated by the common third reference current generation circuit 44. In this way, since it is not necessary to provide an operational amplifier or the like provided in the cubic component current generation circuit, a reduction in power consumption can be achieved. That is, since the quintic component current is about 1/10 or less of the cubic component current, an effect of reducing power consumption by not providing the operational amplifier or the like is better than an effect of reducing power consumption by providing the reference current generation circuit for each temperature range.

3. Oscillator

Figure 18:
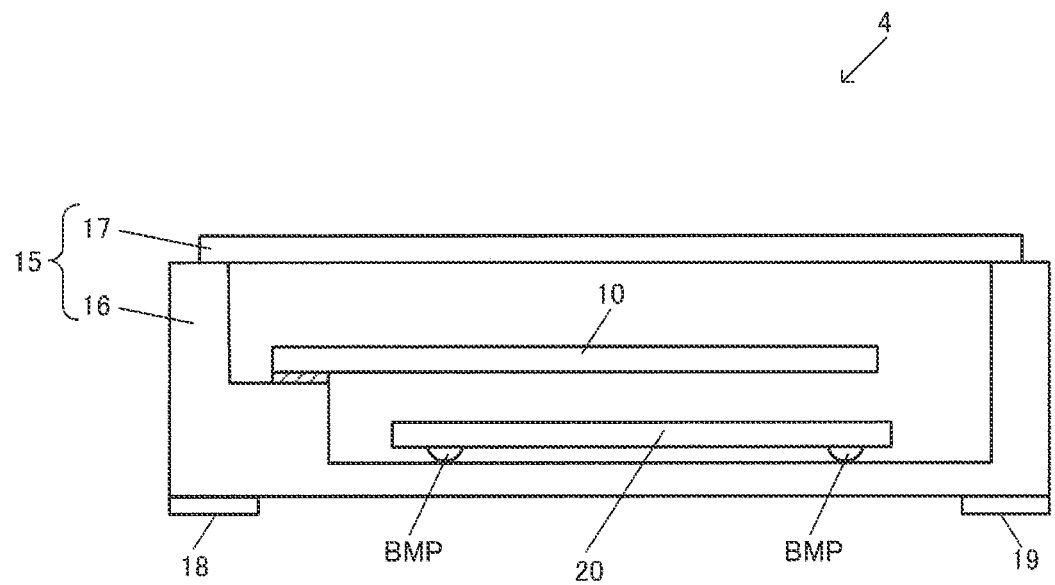
FIG. 18 is a diagram illustrating a first structure example of the oscillator.

FIG. 18 illustrates a first structure example of the oscillator 4 according to the embodiment. The oscillator 4 includes the resonator 10, the circuit device 20, and a package 15 that accommodates the resonator 10 and the circuit device 20. The package 15 is made of, for example, ceramic, and has an accommodating space on an inner side. The resonator 10 and the circuit device 20 are accommodated in the accommodating space. The accommodating space is hermetically sealed, and is desirably in a depressurized state that is a state close to vacuum. With the package 15, the resonator 10 and the circuit device 20 can be suitably protected from impact, dust, heat, moisture, and the like.

The package 15 includes a base 16 and a lid 17. Specifically, the package 15 includes the base 16 that supports the resonator 10 and the circuit device 20, and the lid 17 that is joined to an upper surface of the base 16 such that the accommodating space is defined between the base 16 and the lid 17. The resonator 10 is supported by a step portion, which is provided at an inner side of the base 16, via a terminal electrode.

The circuit device 20 is disposed at an inner bottom surface of the base 16. Specifically, the circuit device 20 is disposed such that an active surface thereof faces the inner bottom surface of the base 16. The active surface is a surface at which a circuit element of the circuit device 20 is formed. Bumps BMP are formed at terminals of the circuit device 20. The circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, the terminal electrode, and the like. The circuit device 20 is electrically coupled to external terminals 18 and 19 of the oscillator 4 via the bumps BMP and the internal wiring of the package 15. The external terminals 18 and 19 are formed at an outer bottom surface of the package 15. The external terminals 18 and 19 are coupled to an external device via an external wiring. The external wiring is, for example, a wiring formed at a circuit board on which the external device is mounted. Accordingly, a clock signal or the like can be output to the external device.

Although the circuit device 20 is flip mounted such that the active surface of the circuit device 20 faces downward in FIG. 18, the embodiment is not limited to such mounting. For example, the circuit device 20 may be mounted such that the active surface of the circuit device 20 faces upward. That is, the circuit device 20 is mounted such that the active surface thereof faces the resonator 10.

Figure 19:
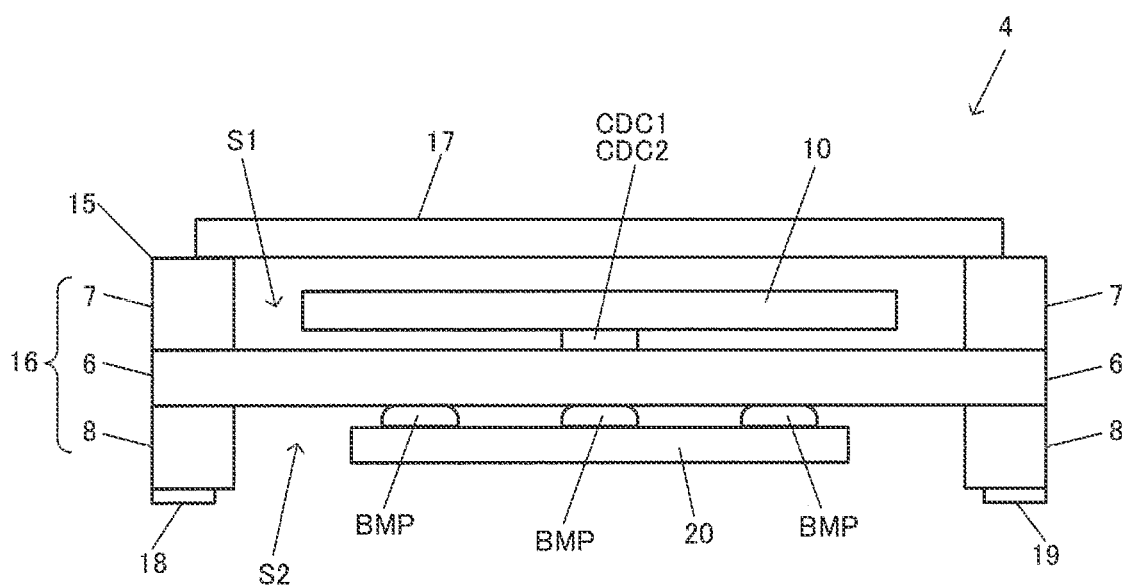
FIG. 19 is a diagram illustrating a second structure example of the oscillator.

FIG. 19 illustrates a second structure example of the oscillator 4. The oscillator 4 includes the resonator 10, the circuit device 20, and the package 15 that accommodates the resonator 10 and the circuit device 20. The package 15 includes the base 16 and the lid 17. The base 16 includes a first substrate 6 that is an intermediate substrate, a second substrate 7 having a substantially rectangular frame shape that is laminated at an upper surface side of the first substrate 6, and a third substrate 8 having a substantially rectangular frame shape that is laminated at a bottom surface side of the first substrate 6. The lid 17 is joined to an upper surface of the second substrate 7, and the resonator 10 is accommodated in an accommodating space S1 that is defined by the first substrate 6, the second substrate 7, and the lid 17. For example, the resonator 10 is hermetically sealed in the accommodating space S1, and the accommodating space S1 is desirably in a depressurized state that is a state close to vacuum. Accordingly, the resonator 10 can be suitably protected from impact, dust, heat, moisture, and the like. The circuit device 20 that is a semiconductor chip is accommodated in an accommodating space S2 defined by the first substrate 6 and the third substrate 8. The external terminals 18 and 19 that are external coupling electrode terminals of the oscillator 4 are formed at a bottom surface of the third substrate 8.

In the accommodating space S1, the resonator 10 is coupled to, by conductive coupling portions CDC1 and CDC2, a first electrode terminal and a second electrode terminal (not illustrated) formed at an upper surface of the first substrate 6.

For example, the conductive coupling portions CDC1 and CDC2 may be implemented by conductive bumps such as metal bumps, or may be implemented by conductive adhesives.

Specifically, for example, a first electrode pad (not illustrated) formed at one end of the tuning fork type resonator 10 is coupled to, via the conductive coupling portion CDC1, the first electrode terminal formed at the upper surface of the first substrate 6. The first electrode terminal is electrically coupled to the pad PX1 of the circuit device 20. A second electrode pad (not illustrated) formed at the other end of the tuning fork type resonator 10 is coupled to, via the conductive coupling portion CDC2, the second electrode terminal formed at the upper surface of the first substrate 6. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed at a plurality of pads of the circuit device 20 that is a semiconductor chip, and these conductive bumps BMP are coupled to a plurality of electrode terminals formed at a bottom surface of the first substrate 6. The electrode terminals coupled to the pads of the circuit device 20 are electrically coupled to the external terminals 18 and 19 of the oscillator 4 via an internal wiring or the like.

The oscillator 4 may be an oscillator of a wafer level package (WLP). In this case, the oscillator 4 includes: a base that includes a semiconductor substrate and a penetration electrode penetrating between a first surface and a second surface of the semiconductor substrate; the resonator 10 that is fixed to the first surface of the semiconductor substrate via a conductive joining member such as a metal bump; and an external terminal that is provided at a second surface side of the semiconductor substrate via an insulating layer such as a re-wiring layer. An integrated circuit serving as the circuit device 20 is formed at the first surface or the second surface of the semiconductor substrate. In this case, by bonding a first semiconductor wafer disposed with a plurality of bases, each having the resonator 10 and an integrated circuit, to a second semiconductor wafer formed with a plurality of lids, the plurality of bases are joined to the plurality of lids, and then dicing of the oscillators 4 is performed using a dicing saw or the like. In this way, the oscillator 4 of the wafer level package can be implemented, and the oscillator 4 can be manufactured with high throughput and low cost.

As described above, the circuit device according to the embodiment includes an oscillation circuit configured to generate an oscillation signal and a temperature compensation circuit configured to perform temperature compensation for an oscillation frequency of the oscillation signal. The temperature compensation circuit includes a first reference current generation circuit configured to generate a first reference current, a second reference current generation circuit configured to generate a second reference current, a first compensation circuit configured to perform temperature compensation for the oscillation frequency in a first temperature range based on the first reference current, and a second compensation circuit configured to perform temperature compensation for the oscillation frequency in a second temperature range, which is higher than the first temperature range in temperature, based on the second reference current. The first reference current generation circuit reduces the first reference current as a temperature rises, or the second reference current generation circuit reduces the second reference current as the temperature drops.

According to the embodiment, the first reference current generation circuit reduces the first reference current as the temperature rises. Accordingly, when the temperature is in the second temperature range on a higher temperature side than the first temperature range, it is possible to sufficiently reduce the first reference current, and it is possible to prevent a current for temperature compensation based on the first reference current or the first reference current from being wastefully consumed. Alternatively, the second reference current generation circuit reduces the second reference current as the temperature drops. Accordingly, when the temperature is in the first temperature range on a low temperature side, it is possible to sufficiently reduce the second reference current, and it is possible to prevent a current for temperature compensation based on the second reference current or the second reference current from being wastefully consumed. Accordingly, a reduction in power consumption of the circuit device and the like can be achieved.

In the embodiment, the first reference current generation circuit may include a first bipolar transistor of an npn type in which a collector and a base are coupled to each other and an emitter is coupled to a low-potential-side power supply node, and a first resistor that is provided between a high-potential-side power supply node and the first bipolar transistor and whose one end on a high-potential-side power supply node side is set to a voltage having a negative temperature characteristic.

As described, since a node at the one end on the high-potential-side power supply node side of the first resistor is set to the voltage having a negative temperature characteristic, a reference current having a negative temperature characteristic can flow through the first resistor, and the first reference current that decreases as the temperature rises can be generated.

In the embodiment, the first reference current generation circuit may include a first operational amplifier to whose non-inverting input terminal a temperature detection voltage having a negative temperature characteristic is input, and a first transistor of a P type that is provided between the high-potential-side power supply node and the first resistor, to whose gate an output of the first operational amplifier is input, and whose drain is coupled to an inverting input terminal of the first operational amplifier and the one end of the first resistor.

In this way, a node of the drain of the first transistor can be set to the temperature detection voltage having a negative temperature characteristic by virtual ground of the first operational amplifier, and the first reference current generation circuit can generate the first reference current having a negative temperature characteristic.

In the embodiment, the second reference current generation circuit may include a second bipolar transistor of an npn type in which a collector and a base are coupled to each other and an emitter is coupled to the low-potential-side power supply node, and a second resistor that is provided between the high-potential-side power supply node and the second bipolar transistor and whose one end on the high-potential-side power supply node side is set to a voltage having a positive temperature characteristic.

As described, since a node at the one end on the high-potential-side power supply node side of the second resistor is set to the voltage having a positive temperature characteristic, a reference current having a positive temperature characteristic can flow through the second resistor, and the second reference current that decreases as the temperature drops can be generated.

In the embodiment, the second reference current generation circuit may include a second operational amplifier to whose non-inverting input terminal a temperature detection voltage having a positive temperature characteristic is input, and a second transistor of a P type that is provided between the high-potential-side power supply node and the second resistor, to whose gate an output of the second operational amplifier is input, and whose drain is coupled to an inverting input terminal of the second operational amplifier and the one end of the second resistor.

In this way, a node of the drain of the second transistor can be set to the temperature detection voltage having a positive temperature characteristic by virtual ground of the second operational amplifier, and the second reference current generation circuit can generate the second reference current having a positive temperature characteristic.

In the embodiment, the second reference current generation circuit may include a second bipolar transistor of an npn type in which a collector and a base are coupled to each other and an emitter is coupled to the low-potential-side power supply node, a third bipolar transistor in which a collector and a base are coupled to each other and an emitter is coupled to the collector of the second bipolar transistor, and a second resistor provided between the high-potential-side power supply node and the third bipolar transistor.

In this way, by setting a bipolar transistor serving as a reference current source in multiple stages, it is possible to generate the appropriate second reference current having a positive temperature characteristic while preventing an increase in circuit area.

In the embodiment, a resistance value of the second resistor may be smaller than a resistance value of the first resistor.

Since the resistance value of the second resistor is made smaller than the resistance value of the first resistor as described, the second reference current can be set to a larger current value than the first reference current, and current adjustment in the second compensation circuit can be implemented while preventing an increase in circuit area.

In the embodiment, the second reference current at an upper limit of the second temperature range may be larger than the first reference current at a lower limit of the first temperature range.

In this way, the current adjustment in the second temperature range on a high temperature side, which is wider than the first temperature range on a low temperature side, is performed by the second compensation circuit. Also in this case, in the embodiment, since the first reference current generation circuit on the low temperature side and the second reference current generation circuit on the high temperature side are separately provided, it is possible to achieve appropriate current adjustment in the first temperature range and the second temperature range while preventing an increase in circuit area.

In the embodiment, the first compensation circuit may include a first differential pair circuit. The first differential pair circuit may include first differential pair transistors a current flowing through one of which is controlled according to a temperature detection signal, and a first current source transistor that flows a reference current obtained by mirroring the first reference current through the first differential pair transistors. The second compensation circuit may include a second differential pair circuit. The second differential pair circuit may include second differential pair transistors a current flowing through one of which is controlled according to the temperature detection signal, and a second current source transistor that flows a reference current obtained by mirroring the second reference current through the second differential pair transistors.

In this way, a first current for temperature compensation in the first temperature range can be generated by controlling the current flowing through one transistor of the first differential pair transistors based on the temperature detection signal while causing the reference current obtained by mirroring the first reference current to flow through the first differential pair transistors of the first compensation circuit. Further, a second current for temperature compensation in the second temperature range can be generated by controlling the current flowing through one transistor of the second differential pair transistors based on the temperature detection signal while causing the reference current obtained by mirroring the second reference current to flow through the second differential pair transistors of the second compensation circuit.

In the embodiment, the temperature compensation circuit may include a current generation circuit configured to generate, based on a first current and a second current, a function current for compensating a temperature characteristic of the oscillation frequency, the first current being generated by the first compensation circuit based on the first reference current and a temperature detection signal and the second current being generated by the second compensation circuit based on the second reference current and the temperature detection signal. Further, the temperature compensation circuit may include a current-voltage conversion circuit configured to perform current-voltage conversion on the function current to output a temperature compensation voltage for controlling the oscillation frequency to the oscillation circuit.

In this way, the function current, which includes the first current generated by the first compensation circuit based on the first reference current and the temperature detection signal, is subjected to the current-voltage conversion performed by the current-voltage conversion circuit, so that a temperature compensation voltage for performing temperature compensation in the first temperature range is generated. Further, the function current, which includes the second current generated by the second compensation circuit based on the second reference current and the temperature detection signal is subjected to the current-voltage conversion performed by the current-voltage conversion circuit, so that a temperature compensation voltage for performing temperature compensation in the second temperature range is generated.

In the embodiment, a third reference current generation circuit configured to generate a third reference current may be provided.

The current generation circuit may include a k-th order component current generation circuit configured to generate, as a k-th order component current of the function current, the first current generated based on the first reference current and the second current generated based on the second reference current, and an m-th order component current generation circuit configured to generate an m-th order component current of the function current based on the third reference current.

In this way, the k-th order component current of the function current is generated based on the first reference current in the first temperature range, and is generated based on the second reference current in the second temperature range. Accordingly, a reduction in power consumption can be achieved. On the other hand, the m-th order component current is generated based on the third reference current, so that the power consumption of the entire temperature compensation circuit can be reduced.

In the embodiment, the k-th order component current may be a component current having a lower order than the m-th order component current.

In this way, when the temperature is in one of the first temperature range and the second temperature range, it is possible to prevent a current in the other temperature range from being wastefully consumed, and the m-th order component current that is a higher-order component current is generated based on the third reference current, so that it is possible to reduce the power consumption in the entire temperature compensation circuit.

An oscillator according to the embodiment includes a resonator and a circuit device. The circuit device includes an oscillation circuit configured to oscillate the resonator to generate an oscillation signal, and a temperature compensation circuit configured to perform temperature compensation on an oscillation frequency of the oscillation signal. The temperature compensation circuit includes a first compensation circuit configured to perform temperature compensation for the oscillation frequency in a first temperature range, a second compensation circuit configured to perform temperature compensation for the oscillation frequency in a second temperature range, which is higher than the first temperature range in temperature, a first reference current generation circuit configured to generate a first reference current serving as a reference current of the first compensation circuit, and a second reference current generation circuit configured to generate a second reference current serving as a reference current of the second compensation circuit. The first reference current generation circuit reduces the first reference current as a temperature rises, or the second reference current generation circuit reduces the second reference current as the temperature drops.

Although the embodiment has been described in detail above, it will be easily understood by those skilled in the art that many modifications can be made without substantially departing from the novel matters and effects according to the present disclosure. Therefore, all such modifications are intended to be included within the scope of the present disclosure. For example, a term cited with a different term having a broader meaning or the same meaning at least once in the specification or in the drawings can be replaced with the different term at any place in the specification or in the drawings. In addition, all combinations of the embodiment and the modifications are also included in the scope of the present disclosure. The configurations, operations, and the like of the circuit device and the oscillator are not limited to those described in the embodiment, and various modifications can be made.

What is claimed is:

1. A circuit device comprising:
an oscillation circuit configured to generate an oscillation signal; and
a temperature compensation circuit configured to perform temperature compensation for an oscillation frequency of the oscillation signal, the temperature compensation circuit including:
   a first reference current generation circuit configured to generate a first reference current;
   a second reference current generation circuit configured to generate a second reference current;
   a first compensation circuit configured to perform the temperature compensation for the oscillation frequency in a first temperature range based on the first reference current; and
   a second compensation circuit configured to perform the temperature compensation for the oscillation frequency in a second temperature range, which is higher than the first temperature range in temperature, based on the second reference current, wherein
the first reference current generation circuit is configured to reduce the first reference current as a temperature rises, or the second reference current generation circuit is configured to reduce the second reference current as the temperature drops, and
the second temperature range is larger than the first temperature range.

2. The circuit device according to claim 1, wherein
the second reference current at an upper limit of the second temperature range is larger than the first reference current at a lower limit of the first temperature range.

3. The circuit device according to claim 1, wherein
the first compensation circuit includes
   a first differential pair circuit including: first differential pair transistors a current flowing through one of which is controlled according to a temperature detection signal; and a first current source transistor that flows a reference current obtained by mirroring the first reference current through the first differential pair transistors, and
the second compensation circuit includes
   a second differential pair circuit including: second differential pair transistors a current flowing through one of which is controlled according to the temperature detection signal; and a second current source transistor that flows a reference current obtained by mirroring the second reference current through the second differential pair transistors.

4. The circuit device according to claim 1, wherein
the temperature compensation circuit includes:
   a current generation circuit configured to generate, based on a first current and a second current, a function current for compensating a temperature characteristic of the oscillation frequency, the first current being generated by the first compensation circuit based on the first reference current and a temperature detection signal and the second current being generated by the second compensation circuit based on the second reference current and the temperature detection signal; and
   a current-voltage conversion circuit configured to perform current-voltage conversion on the function current to output a temperature compensation voltage for controlling the oscillation frequency to the oscillation circuit.

5. The circuit device according to claim 4, further comprising:
a third reference current generation circuit configured to generate a third reference current, wherein
the current generation circuit includes:
   a k-th order component current generation circuit configured to generate, as a k-th order component current of the function current, the first current generated based on the first reference current and the second current generated based on the second reference current; and
   an m-th order component current generation circuit configured to generate an m-th order component current of the function current based on the third reference current.

6. The circuit device according to claim 5, wherein
the k-th order component current is a component current having a lower order than the m-th order component current.

7. A circuit device comprising:
an oscillation circuit configured to generate an oscillation signal; and
a temperature compensation circuit configured to perform temperature compensation for an oscillation frequency of the oscillation signal, the temperature compensation circuit including:
   a first reference current generation circuit configured to generate a first reference current;
   a second reference current generation circuit configured to generate a second reference current;
   a first compensation circuit configured to perform the temperature compensation for the oscillation frequency in a first temperature range based on the first reference current; and
   a second compensation circuit configured to perform the temperature compensation for the oscillation frequency in a second temperature range, which is higher than the first temperature range in temperature, based on the second reference current, wherein
the first reference current generation circuit is configured to reduce the first reference current as a temperature rises, or the second reference current generation circuit is configured to reduce the second reference current as the temperature drops, and
the first reference current generation circuit includes:
   a first bipolar transistor of an npn type in which a collector and a base are coupled to each other and an emitter is coupled to a low-potential-side power supply node; and
   a first resistor that is provided between a high-potential-side power supply node and the first bipolar transistor and whose one end on a high-potential-side power supply node side is set to a voltage having a negative temperature characteristic.

8. The circuit device according to claim 7, wherein
the first reference current generation circuit includes:

a first operational amplifier to whose non-inverting input terminal a temperature detection voltage having a negative temperature characteristic is input; and a first transistor of a P type that is provided between the high-potential-side power supply node and the first resistor, to whose gate an output of the first operational amplifier is input, and whose drain is coupled to an inverting input terminal of the first operational amplifier and the one end of the first resistor.

9. The circuit device according to claim 7, wherein the second reference current generation circuit includes:

a second bipolar transistor of an npn type in which a collector and a base are coupled to each other and an emitter is coupled to the low-potential-side power supply node; and a second resistor that is provided between the high-potential-side power supply node and the second bipolar transistor and whose one end on the high-potential-side power supply node side is set to a voltage having a positive temperature characteristic.

10. The circuit device according to claim 9, wherein the second reference current generation circuit includes:

a second operational amplifier to whose non-inverting input terminal a temperature detection voltage having a positive temperature characteristic is input; and a second transistor of a P type that is provided between the high-potential-side power supply node and the second resistor, to whose gate an output of the second operational amplifier is input, and whose drain is coupled to an inverting input terminal of the second operational amplifier and the one end of the second resistor.

11. The circuit device according to claim 7, wherein the second reference current generation circuit includes:

a second bipolar transistor of an npn type in which a collector and a base are coupled to each other and an emitter is coupled to the low-potential-side power supply node;

a third bipolar transistor in which a collector and a base are coupled to each other and an emitter is coupled to the collector of the second bipolar transistor; and a second resistor provided between the high-potential-side power supply node and the third bipolar transistor.

12. The circuit device according to claim 9, wherein a resistance value of the second resistor is smaller than a resistance value of the first resistor.

13. An oscillator comprising:

a resonator; and a circuit device, wherein the circuit device includes:

an oscillation circuit configured to oscillate the resonator to generate an oscillation signal; and a temperature compensation circuit configured to perform temperature compensation for an oscillation frequency of the oscillation signal, the temperature compensation circuit includes:

a first compensation circuit configured to perform the temperature compensation for the oscillation frequency in a first temperature range;

a second compensation circuit configured to perform the temperature compensation for the oscillation frequency in a second temperature range that is higher than the first temperature range in temperature;

a first reference current generation circuit configured to generate a first reference current serving as a reference current of the first compensation circuit; and a second reference current generation circuit configured to generate a second reference current serving as a reference current of the second compensation circuit, the first reference current generation circuit is configured to reduce the first reference current as a temperature rises, or the second reference current generation circuit is configured to reduce the second reference current as the temperature drops, and the second temperature range is larger than the first temperature range.

* * * * *